（12）United States Patent
Morita et al.

(10) Patent No.: US 6,716,663 B2
(45) Date of Patent: Apr. 6, 2004

(54) METHOD FOR REMOVING FOREIGN MATTER, METHOD FOR FORMING FILM, SEMICONDUCTOR DEVICE AND FILM FORMING APPARATUS

(75) Inventors: Kiyoyuki Morita, Kyoto (JP); Takashi Ohtsuka, Osaka (JP); Michihito Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/230,258

(22) Filed: Aug. 29, 2002

(65) Prior Publication Data

US 2003/0003770 A1 Jan. 2, 2003

Related U.S. Application Data

(63) Continuation of application No. 09/492,350, filed on Jan. 27, 2000, now Pat. No. 6,541,278.

(30) Foreign Application Priority Data

Jan. 27, 1999 (JP) .............................. 11-018597
Apr. 13, 1999 (JP) .............................. 11-104873

(51) Int. Cl.[7] ................... H01L 21/00; H01L 21/8242; H01L 51/40; C23C 14/10; C23C 16/06
(52) U.S. Cl. .................. 438/99; 438/3; 438/240; 427/255.4; 427/255.27; 427/255.32
(58) Field of Search ................. 438/99, 3, 240; 427/255.27, 255.4, 255.32

(56) References Cited

U.S. PATENT DOCUMENTS

| | | | | |
|---|---|---|---|---|
| 4,734,451 A | * | 3/1988 | Smith | 524/493 |
| 4,970,093 A | * | 11/1990 | Sievers et al. | 427/575 |
| 5,698,163 A | | 12/1997 | Mandel | |
| 5,789,027 A | | 8/1998 | Watkins et al. | |
| 5,908,510 A | | 6/1999 | McCullough et al. | |
| 6,149,828 A | | 11/2000 | Vaartstra | |
| 6,208,234 B1 | * | 3/2001 | Hunt et al. | 338/308 |
| 6,217,623 B1 | * | 4/2001 | Reichert et al. | 29/623.5 |

* cited by examiner

*Primary Examiner*—Caridad Everhart
*Assistant Examiner*—Chuong A Luu
(74) *Attorney, Agent, or Firm*—McDermott, Will & Emery

(57) ABSTRACT

A semiconductor substrate is placed within a housing. By supplying organometallic complexes and carbon dioxide in a supercritical state into the housing, a BST thin film is formed on a platinum thin film, while at the same time, carbon compounds, which are produced when the BST thin film is formed, are removed. The solubility of carbon compounds in the supercritical carbon dioxide is very high, and yet the viscosity of the supercritical carbon dioxide is low. Accordingly, the carbon compounds are removable efficiently from the BST thin film. An oxide or nitride film may also be formed by performing oxidation or nitriding at a low temperature using water in a supercritical or subcritical state, for example.

13 Claims, 14 Drawing Sheets

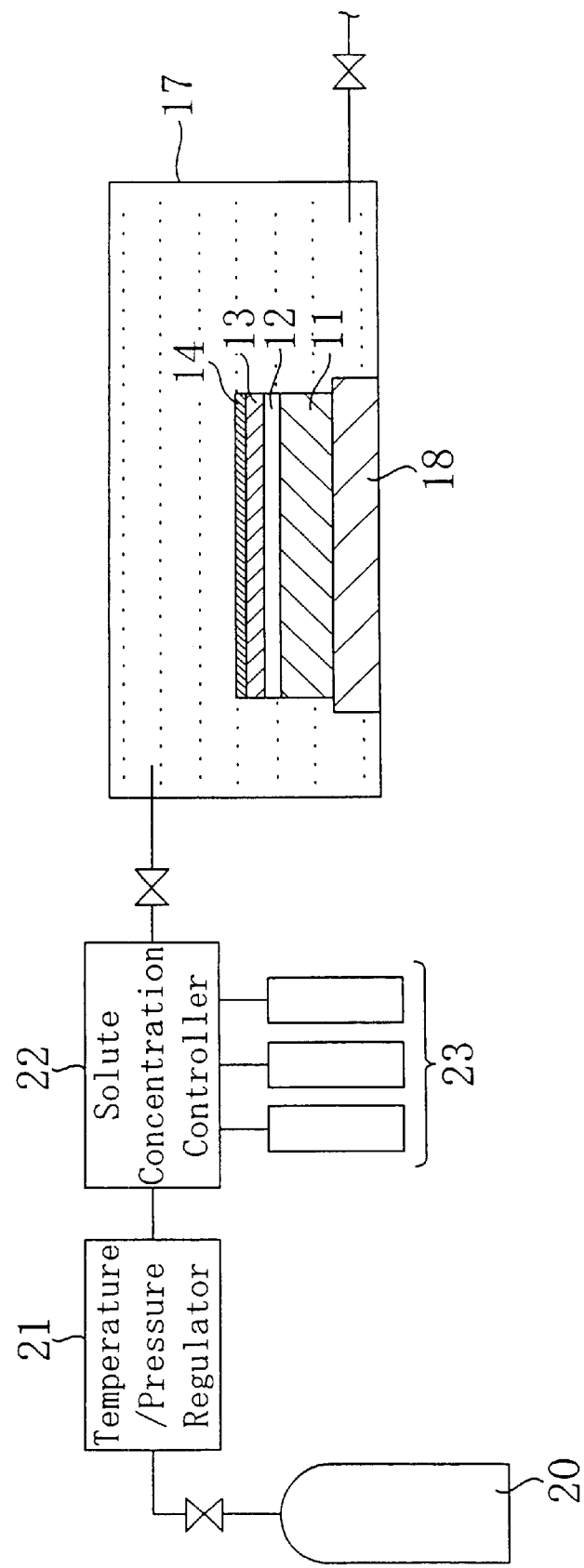

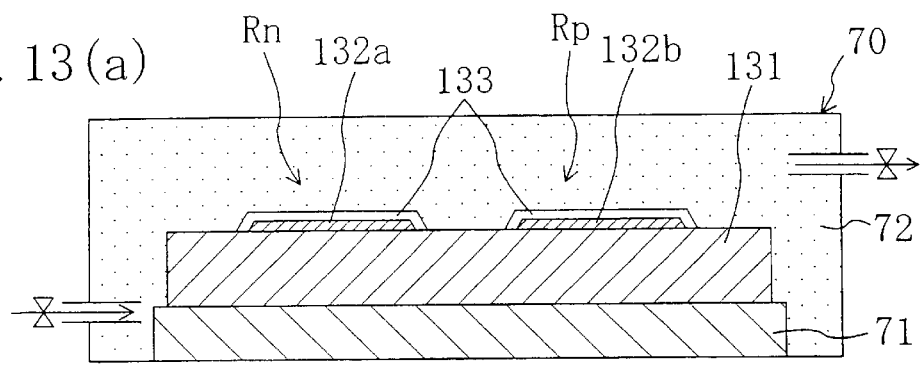
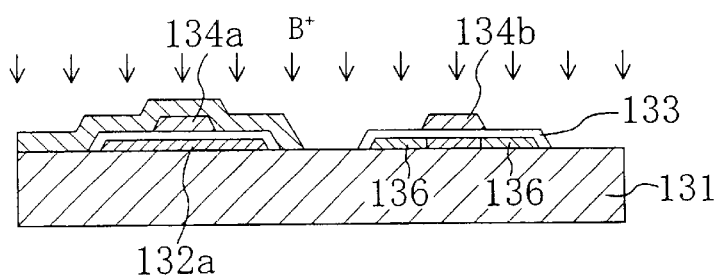
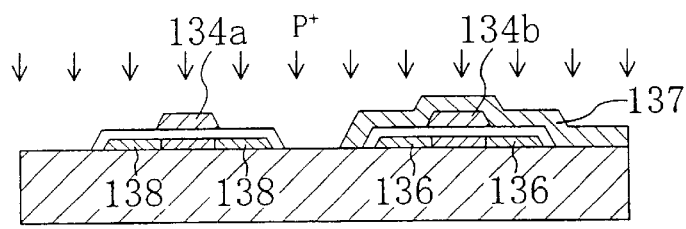
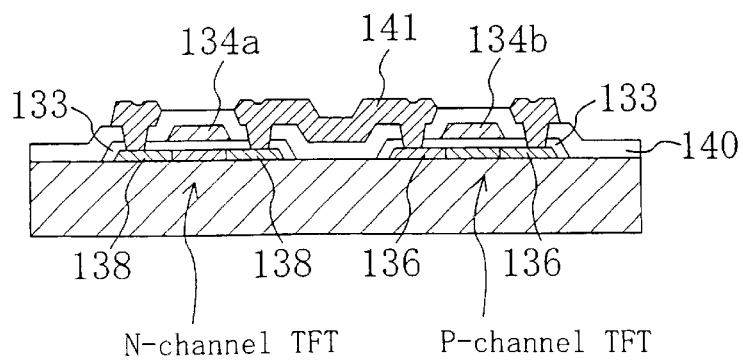

METHOD FOR REMOVING FOREIGN MATTER, METHOD FOR FORMING FILM, SEMICONDUCTOR DEVICE AND FILM FORMING APPARATUS

BACKGROUND OF THE INVENTION

The present invention generally relates to a method for removing foreign matter using a supercritical or subcritical medium, and more particularly relates to a method for forming a dielectric film such as a silicon dioxide film or ferroelectric film, a semiconductor device and a film deposition apparatus.

As the quantity of data processable per unit time by present-day high-performance electronic units goes on increasing, demand for large-capacity memories with a capacitive insulating film, like dynamic random access memories (DRAMs), is escalating. However, increase in area occupied by memories on a chip should be minimized to meet the downsizing requirement imposed on the electronic units of today. Thus, to realize a large-capacity memory while avoiding the increase in occupied area, capacitance per unit area of an insulating material for the capacitive insulating film should be increased to such a level that the memory does operate normally even if the area of a unit cell is reduced. For that purpose, capacitive insulating films made of ferroelectric or high-dielectric-constant materials have been applied recently.

Examples of high-dielectric-constant materials include Ba—Sr—Ti—O (BST) and Pb—Zr—Ti—O (PZT). When a high-dielectric-constant material is used, the stereoscopic configuration of a cell should be modified in some way or other to realize a DRAM with a capacity on the order of at least 1 gigabits and preferably more. For example, the area of the capacitor cell can be reduced and yet a sufficient quantity of charge can be stored in a unit area if tiny stepped portions are provided. Ferroelectric materials such as Sr—Bi—O (SBO) and Sr—Ta—Nb—O (STN) are adopted to take advantage of the spontaneous residual polarization of dielectric materials. If a ferroelectric material is used, however, resultant step coverage will be not so good. That is to say, it is usually difficult to form a ferroelectric thin film with a uniform thickness over the stepped portions.

As can be seen, no matter whether the high-dielectric-constant material or ferroelectric material is used, a technique of forming a thin film of either material over tiny stepped portions at a good coverage plays a key role to attain a desired capacity. As for the step coverage, a CVD process is superior to a sputtering technique, for example. This is why research and development has been carried on vigorously to form a film with good dielectric properties by a CVD process.

Examples of the CVD processes applicable to deposition of a BST or PZT film include a thermal CVD process and a plasma-enhanced CVD process. According to the thermal CVD process, organometallic complexes, containing the constituent metal elements of the film to be formed, are used as source materials. These organometallic complexes are dissolved in a solvent such as butyl acetate or tetrahydrofuran (THF), vaporized and then introduced into a reaction chamber, thereby causing a chemical reaction among them on a heated substrate. According to the plasma-enhanced CVD process, reaction of organometallic complexes on a substrate is accelerated by plasma generated within a reaction chamber. Also, in the thermal or plasma-enhanced CVD process, a plurality of source materials may be mixed at a predetermined ratio by various techniques. For example, according to a technique, respective solutions of organometallic complexes are mixed at the predetermined ratio and then vaporized. Another technique is vaporizing respective solutions of organometallic complexes and solvents and then mixing the resultant gases at the desired ratio. For instance, in depositing a BST film by a CVD process, three organometallic complexes $Ba(DPM)_2$, $Sr(DPM)_2$ and $Ti(O-iPr)_2(DPM)_2$ (where DPM is dipivaloylmethanato) are used as respective source materials, dissolved in a solvent such as butyl acetate at room temperature and then mixed at a predetermined weight ratio. Next, the mixture is introduced into, and vaporized by, a vaporizer that has been heated up to about 220° C. Thereafter, these three organometallic complexes vaporized are introduced into a reaction chamber, in which a substrate has been heated up to about 400° C. to about 700° C. And then these three organometallic complexes vaporized are allowed to react with each other on the substrate, thereby forming a BST film thereon.

The organometallic complexes such as these are likely to combine with each other to form a copolymer, generally speaking. Accordingly, a variation in vaporization temperature or decomposition happens easily. Thus, in many cases, the formation of such a copolymer is prevented by a steric hindrance state, which has been created through the coordination of a so-called "adduct" such as a tetraglyme group.

In recent years, a complementary MOS (CMOS) LSI including CMOS transistors has been further downsized, and a CMOS LSI with a design rule of 0.25 µm has been used practically these days. An MOS transistor is a device with four terminals, i.e., gate, source, drain and semiconductor substrate. The gate electrode and the semiconductor substrate are electrically isolated from each other due to the existence of a gate insulating film therebetween. The potential at the gate electrode changes the quantity of carriers to be induced in a region of the semiconductor substrate just under the gate insulating film (i.e., channel region) and also changes the amount of drain current flowing. Based on this principle, the current flowing between the source and drain in the MOS transistor is controllable in terms of the value and ON/OFF states thereof.

In this case, no leakage current should flow between the gate electrode and any other terminal (i.e., source, drain or semiconductor substrate) in a single MOS transistor. Accordingly, the gate insulating film is required to exhibit very high insulation properties and reliability. For example, in an MOS transistor included in a CMOS LSI with a design rule of 0.5 µm, the thickness of the gate insulating film is about 10 nm and the intensity of an electric field applied to the gate electrode during the operation of the transistor is 3 to 4 MV/cm. In this case, since the maximum rated electric field is about 8 MV/cm, the dielectric breakdown voltage of the gate insulating film should be about 10 MV/cm. Also, the gate insulating film needs to ensure good reliability for 10 years if the film is subjected to a TDDB test, for example.

To meet all of these severe requirements, a silicon dioxide film of quality has heretofore been used as gate insulating film for an MOS transistor. The silicon dioxide film is often formed by a so-called thermal oxidation process. Specifically, a silicon substrate is placed within an electric furnace and then heated up to 800 to 900° C. with oxygen or water vapor introduced into the electric furnace, thereby growing a silicon dioxide film on the silicon substrate. The silicon dioxide film grown is sometimes densified within a non-oxidizing gas such as nitrogen gas by being heated up to the maximum temperature in all the process steps to be performed before the transistor is completed. The gate insulating film ensuring very high reliability has been formed in this manner.

Parts of a transistor that should be made of an insulating film of quality are not limited to the gate insulating film. For instance, a passivation film of silicon dioxide is also required to be no less reliable than the gate insulating film is. Specifically, the gate electrode of a transistor has been made of polycrystalline silicon (poly-Si) such that source/drain regions can be self-aligned with the gate electrode. In this case, the gate electrode is formed by patterning a polysilicon film and then the $SiO_2$ passivation film is formed on the surface of the gate electrode to prevent leakage current from flowing between the surrounding portions of the gate electrode and the semiconductor substrate.

Furthermore, the same statement is equally applicable to various MOS devices other than an MOS transistor. For example, a capacitive insulating film, which is interposed between upper and lower electrodes of an MOS capacitor (i.e., the semiconductor substrate and polysilicon electrode), is also required to be as reliable as the gate insulating film. The same requirement is also imposed on a capacitive insulating film for a trench capacitor as an MOS device and on a capacitive insulating film that is formed on a storage node of a DRAM memory cell as an MIM capacitor.

It is known, however, that a large quantity of carbon compounds is left within a dielectric film that has been formed using the CVD source materials. The existence of carbon compounds in a dielectric film affects the electrical characteristics of a semiconductor device including the dielectric film. For example, the dielectric constant of the dielectric film decreases or leakage current increases due to the residual carbon compounds. Also, if the residual carbon compounds change into mobile ions, then the ions move along with the electric field resulting from the operation of capacitors and are segregated at an interface, thus possibly deteriorating the reliability of the dielectric film.

Carbon compounds left in a dielectric film can be removed by heating the dielectric film up to an elevated temperature of 800° C. or more. However, if heat treatment is conducted at such a high temperature, then the characteristics of an MOS transistor that has already been formed on a substrate are affected. Accordingly, that high-temperature heat treatment is disadvantageous for the overall fabrication process, because the resultant characteristics of the semiconductor device are likely to deteriorate and because the processing efficiency is not so good.

Such an adverse phenomenon may occur not just in the dielectric film of a semiconductor device but also in any other components of the semiconductor device or components of any device other than the semiconductor device.

Also, the gate insulating film, passivation film or capacitive insulating film that is formed by thermal oxidation as in the prior art would not be able to cope with forthcoming further miniaturization or performance enhancement of MOS devices.

Among other things, while a silicon substrate or a polysilicon gate electrode formed on the silicon substrate is thermally oxidized, the profile of a dopant that has been introduced into the substrate or electrode changes as the substrate or electrode is held at an elevated temperature during the thermal oxidation. This is a serious problem, because the performance of the transistor deteriorates in that situation. In a thermal oxidation process, the temperature of a silicon substrate is generally kept as high as 800° C. or more. At such an elevated temperature, a dopant that has been introduced into the silicon substrate diffuses. Thus, the as-designed dopant profile cannot be maintained and the performance of the transistor deteriorates. Also, if thermal oxidation is conducted after source/drain regions have been defined (e.g., when a capacitive insulating film is formed for a DRAM memory cell), then the dopant that has been introduced to form the source/drain regions diffuses, too. As a result, a shallow diffused layer cannot be formed, thereby constituting a great obstacle to the miniaturization of MOS devices. Furthermore, in a CMOS transistor of a dual-gate type, boron that has been doped into the gate electrode of a p-channel MOS transistor diffuses from the gate electrode into the semiconductor substrate or gate insulating film as a result of heat treatment, thus also deteriorating the performance of the transistor.

According to the prior art thermal oxidation technique, it is difficult to form a silicon dioxide film exhibiting good insulation properties at a low temperature of 600° C. or less. This is because the oxidation rate of silicon is very low in this temperature range. To increase the oxidation rate, the pressure of water vapor may be raised. By adopting this idea, a technique of carrying out thermal oxidation at 10 atmospheric pressure or less was proposed (see Tsubouchi et al., Materials for Meeting of Technical Group on Electronic Part Materials No. CPM-79-36 (1979), Institute of Electronic, Information and Communication Engineers of Japan). In this pressure range, however, a practical oxidation rate is not attainable at 600° C. or less.

In some cases, a silicon nitride or silicon oxynitride film is used instead of a silicon dioxide film. But similar unwanted phenomenon occurs because the temperature of a substrate should also be kept high in the process step of nitriding silicon as in the oxidation process step.

SUMMARY OF THE INVENTION

A primary object of the present invention is providing (1) a method for efficiently removing foreign matter from inside a substance, which is applicable to the formation of a dielectric film with excellent properties and (2) a method and apparatus for forming a film using this foreign matter removing method.

Another object of the present invention is providing a method of forming a film for a high-performance semiconductor device by forming an insulating film of quality at a temperature low enough to prevent the diffusion of a dopant introduced into a semiconductor substrate and by eliminating the high-temperature process as much as possible.

According to an inventive method for removing foreign matter from an object to be processed, the foreign matter is removed by exposing the object to a fluid, which dissolves the foreign matter, while keeping the fluid in a supercritical or subcritical state.

In general, the ability of a fluid to dissolve foreign matter greatly improves in its supercritical or subcritical state. According to the method of the present invention, the foreign matter can be removed from inside an object by taking advantage of this action of the fluid. In this case, the fluid can enter the supercritical or subcritical state at a relatively low temperature, generally speaking. Thus, the foreign matter can be removed easily even if the object is not heated to an excessively high temperature. That is to say, foreign matter can be removed from even an object, which usually deteriorates at an elevated temperature, without degrading the quality of the object. In addition, since excellent processing efficiency is attainable, it takes just a short time to remove the foreign matter.

In one embodiment of the present invention, the object may be made of a first substance that has been produced as a result of a reaction of a source material containing an organic metal or an organometallic complex. And the foreign matter may be a second substance made of a carbon compound that has also been produced as a result of the reaction of the source material containing the organic metal. In such an embodiment, the carbon compound is removable easily even if the object is not heated to an excessively high temperature. An object made of a substance that has been produced as a result of a reaction of a source material containing organic metals or organometallic complexes (usually, an MOCVD process) contains a particularly large quantity of carbon compounds. Even so, the carbon compounds are removable easily without deteriorating the quality thereof, because the object is not heated too much.

In this particular embodiment, the object may be a film that has been formed with the source material containing the organic metal or the organometallic complex dissolved in a solvent thereof. Although the carbon compounds are very likely to be left in such a case, the carbon compounds are still removable efficiently.

Specifically, the solvent of the source material is preferably at least one compound selected from the group consisting of hydrocarbon and halogenated hydrocarbon compounds. Even though the hydrocarbon or halogenated hydrocarbon compound is very likely to be left in the film in such a case, the hydrocarbon or halogenated hydrocarbon compound is still removable efficiently.

More particularly, the source material may be a compound containing a dipivaloylmethanato (DPM) group. In such a case, a film made of a high-dielectric-constant material such as BST is formed and a lot of carbon compounds, which constitute methoxy groups, for example, are left in the film. Even so, the carbon compounds are easily removable efficiently.

In another embodiment, carbon dioxide may be used as the fluid. Foreign materials like carbon compounds are highly soluble in carbon dioxide in the supercritical or subcritical state. Thus, the foreign matter removal ability can reach an amazingly high level in such an embodiment.

A first exemplary film forming method according to the present invention is adapted to form a film on a substrate using a source material, which produces first and second substances when reacted, such that the film is made of the first substance. The method includes the steps of: a) preparing the source material and a solvent that dissolves the second substance; b) keeping the temperature and pressure of the solvent in a supercritical or subcritical state; and c) heating the substrate such that the surface of the substrate is kept at such a temperature as allowing the source material to react, while making the source material and the solvent in the supercritical or subcritical state come into contact with the surface of the substrate such that a film is formed on the substrate out of the first substance and that the second substance is dissolved in the solvent and removed.

According to this method, a film can be formed out of the first substance, while at the same time, the second substance, which is going to enter the film, can be blocked and dissolved in the solvent. This is because the ability of the solvent greatly improves in its supercritical or subcritical state. Thus, a film can be formed out of only the first substance without performing any additional process step of removing the second substance after that.

In one embodiment of the present invention, the solvent preferably dissolves the source material in the supercritical or subcritical state.

In another embodiment of the present invention, a compound containing an organic metal or an organometallic complex may be prepared in the step a) as the source material. A film can be formed at a low temperature in such a case. Thus, even if a component, which usually exhibits inferior performance at an elevated temperature, is provided on a substrate, such decline in performance is suppressible.

In this particular embodiment, a compound containing a dipivaloylmethanato (DPM) group may be prepared in the step a) as the compound containing the organic metal or the organometallic complex. In such a case, a BST film, which shows a high dielectric constant but to which carbon compounds are easily mixed, is formed. Thus, the present invention is applicable particularly effectively to such a situation.

In still another embodiment, carbon dioxide is preferably prepared in the step a) as the solvent.

In yet another embodiment, a film selected from the group consisting of paraelectric, ferroelectric and metal films may be formed in the step c) as the film made of the first substance.

Specifically, a film selected from the group consisting of crystallized paraelectric, ferroelectric and metal films may be formed in the step c).

In still another embodiment, the substrate may include at least one film selected from the group consisting of paraelectric, ferroelectric and metal films. Then, the first film forming method of the present invention is applicable to fabricating an MFISFET or MFMISFET.

Alternatively, a semiconductor substrate may be used as the substrate. Then, the first film forming method of the present invention is applicable to fabricating an MISFET.

In still another embodiment, a dielectric or metal film in a crystallized state may be formed in the step c) as the film made of the first substance. In such an embodiment, a ferroelectric film with excellent crystallinity can be formed thereon.

An inventive semiconductor device is of an MIS type including a ferroelectric layer and a gate electrode over a semiconductor substrate. The ferroelectric layer has been formed by making a source material, which produces first and second substances when reacted, and a solvent, which dissolves the second substance, come into contact with the surface of the semiconductor substrate, while keeping the temperature and pressure of the solvent in a supercritical or subcritical state.

In this manner, a ferroelectric layer with excellent crystallinity and a great degree of residual polarization, i.e., a ferroelectric film showing much less varied residual polarization among the lots, can be formed. Accordingly, if such a ferroelectric layer is formed in a nonvolatile memory device, then information can be retained a lot more accurately in the device.

In one embodiment of the present invention, the device may further include a paraelectric layer between the ferroelectric layer and the semiconductor substrate. The paraelectric layer has been formed by making the source material, which produces the first and second substances when reacted, and the solvent, which dissolves the second substance, come into contact with the surface of the semiconductor substrate, while keeping the temperature and pressure of the solvent in the supercritical or subcritical state. In such an embodiment, a crystalline paraelectric layer can be formed and the crystallinity of the ferroelectric layer that is formed on the paraelectric layer can be further improved.

A second exemplary film forming method according to the present invention is adapted to form a film on the surface of an object to be processed. The object is exposed to a fluid kept in a supercritical or subcritical state, thereby forming a film out of a reactant, which has been produced as a result of a reaction between a substance contained in the object and a substance contained in the fluid, on the surface of the object.

According to this method, while the fluid is in the supercritical or subcritical state, the surface of the object can be exposed to a substance at a high concentration, which shows high reactivity with the object when vaporized. Thus, a thin film can be formed efficiently. In this case, the fluid can enter the supercritical or subcritical state at a relatively low temperature, generally speaking. Thus, the film can be formed even if the object is not heated to an excessively high temperature. That is to say, the film can be formed on even an object usually exhibiting inferior properties at an elevated temperature without degrading the quality of the object. In addition, since excellent processing efficiency is attainable by appropriately controlling the conditions in the supercritical state, it takes just a short time to form the film.

For example, water in a supercritical state, which is kept at its critical temperature (374° C.) or more and at its critical pressure (22.04 MPa=217.6 atm) or more, functions as an oxidizing agent by itself and dissolves a lot of oxidizing agent like surrounding oxygen. Thus, it is known that a lot of substance can be burned, or oxidized, within that water in the supercritical state, theoretically speaking. If the surface of an Si substrate is exposed to that supercritical water, then a lot more oxidizing agent can be supplied onto the surface of the Si substrate compared to the conventional thermal oxidation technique. Accordingly, a silicon dioxide film can be formed at a temperature as low as 600° C. or less. Also, the silicon dioxide film formed this way has been oxidized by a different mechanism than a native oxide film, which is porous and has low dielectric strength. Thus, the dielectric strength of the silicon dioxide film is superior.

In one embodiment of the present invention, a substance containing oxygen may be used as the fluid, and an oxide film of the substance contained in the object may be formed on the surface of the object.

In this particular embodiment, the fluid may be at least one substance selected from the group consisting of water, oxygen and nitrous oxide.

In another embodiment, a silicon dioxide film may be formed on the surface of the object using a silicon layer as the object.

In an alternative embodiment, a silicon oxynitride film may be formed on the surface of the object using a silicon nitride layer as the object.

In another alternative embodiment, the object on which the oxide film has been formed may be further exposed to a fluid containing nitrogen in a supercritical or subcritical state, thereby changing the oxide film into an oxynitride film.

In still another embodiment, not only at least one of water, oxygen and nitrous oxide but also an oxidation accelerator may be used as the fluid. In such an embodiment, a favorable oxidation-etching balance can be maintained such that oxidation prevails over etching.

In this particular embodiment, at least one of ozone ($O_3$), hydrogen peroxide ($H_2O_2$), nitrogen dioxide ($NO_2$) and nitrogen monoxide (NO) may be used as the oxidation accelerator.

Alternatively, a substance containing chlorine, as well as the substance containing oxygen, may be used as the fluid.

In such an embodiment, a favorable oxidation-etching balance can also be maintained such that oxidation prevails over etching.

In this particular embodiment, the substance containing chlorine may be at least one substance selected from the group consisting of hydrogen chloride, chlorine, sodium chloride, potassium chloride, calcium chloride and other metal chlorides.

In an alternate embodiment, a substance producing alkali metal ions, as well as the substance containing oxygen, may be used as the fluid. In such an embodiment, a favorable oxidation-etching balance can also be maintained such that oxidation prevails over etching.

In still another embodiment, a substance containing nitrogen may be used as the fluid, and a nitride film of the substance contained in the object may be formed on the surface of the object.

Specifically, the fluid may be at least one substance selected from the group consisting of nitrogen, ammonium and an amine.

Alternatively, a silicon nitride film may be formed on the surface of the object using a silicon layer as the object.

An inventive film forming apparatus is adapted to form, on a substrate, a film out of a first substance that has been produced as a result of a reaction of a source material containing an organic metal or an organometallic complex. The apparatus includes: a vessel for placing the substrate therein; a container for storing the source material and a solvent that dissolves a second substance produced as a result of the reaction of the source material; a temperature/pressure regulator for regulating the temperature and pressure of the solvent to keep the solvent in a supercritical or subcritical state; a source material feeder for supplying the source material into the vessel; a source material concentration controller for controlling the concentration of the source material by dissolving the source material that has been supplied from the source material feeder in the solvent; and a substrate temperature control mechanism for keeping the surface of the substrate at such a temperature as allowing the source material to react.

The film forming apparatus can form a film out of the first substance while eliminating the mixture of unwanted substance in the above-described way.

BRIEF DESCRIPTION OF THE DRAWINGS

FIG. 4 is a partial cross-sectional view schematically illustrating a thin-film forming apparatus for forming a thin film in a supercritical fluid according to a second embodiment of the present invention.

FIGS. 13(a) through 13(d) are cross-sectional views illustrating respective process steps, which include the oxidation process of the fourth embodiment, for fabricating a TFT according to a third modified example of the fourth embodiment.

DESCRIPTION OF THE PREFERRED EMBODIMENTS

Hereinafter, preferred embodiments of the method and apparatus for forming a thin film according to the present invention will be described with reference to the accompanying drawings.

Embodiment 1

FIGS. 1(a) through 1(d) are partial cross-sectional views illustrating respective process steps of forming thin films according to a first exemplary embodiment of the present invention.

Figure 1A:
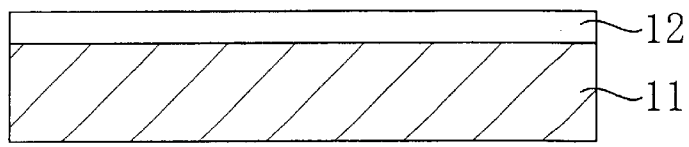
FIGS. 1(a) through 1(d) are partial cross-sectional views illustrating respective process steps of forming thin films according to a first embodiment of the present invention.

First, in the process step shown in FIG. 1(a), a silicon dioxide film 12, which will be shaped into a field oxide, is deposited to a thickness of 400 nm on a semiconductor substrate 11 (e.g., p-type Si substrate) by a thermal oxidation process.

Figure 1B:
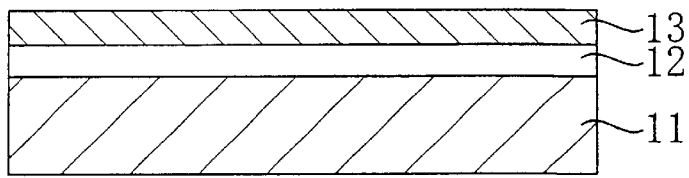

Next, in the process step shown in FIG. 1(b), a platinum thin film 13, which will be shaped into a lower electrode for a capacitor, is deposited to a thickness of about 500 nm on the silicon dioxide film 12.

Figure 1C:
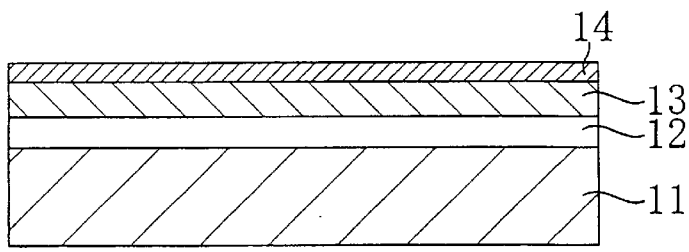

Then, in the process step shown in FIG. 1(c), a BST thin film 14, which will function as a capacitive insulating film for the capacitor, is deposited to a thickness of about 100 nm on the platinum thin film 13.

The BST thin film 14 may be formed by a vaporized solution source CVD process in the following manner. First, source materials Ba(DPM)$_2$, Sr(DPM)$_2$ and Ti(O-iPr)$_2$(DPM)$_2$ are dissolved in a solvent such as butyl acetate or tetrahydrofuran (THF). Then, these solutions are mixed at a predetermined ratio. The resultant mixture is vaporized using a vaporizer that has been heated up to about 220° C. Thereafter, the substrate (i.e., on which the multilayer structure including the platinum thin film 13 has been formed) that has been heated up to about 400 to about 700° C. is exposed to the gas. As a result, the BST thin film 14 is formed on the platinum thin film 13. At this point in time, a large quantity of carbon compounds exists in the BST thin film 14 as described above.

Figure 1D:
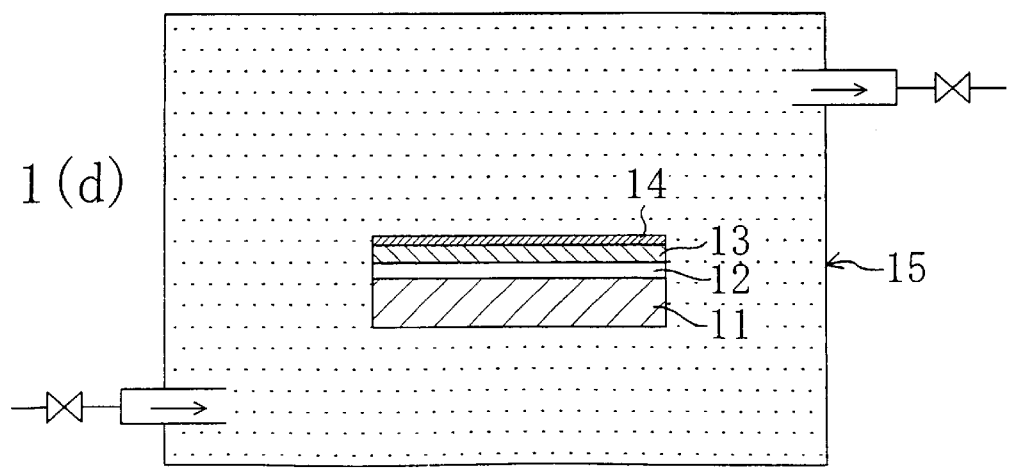

Subsequently, in the process step shown in FIG. 1(d), the substrate is placed within a vessel 15, which may be a housing. The vessel 15 is filled with carbon dioxide, the temperature inside the vessel 15 is kept equal to or higher than the critical temperature Tc of carbon dioxide ($\approx$31.2° C.) and the pressure inside the vessel 15 is kept equal to or higher than the critical pressure Pc of carbon dioxide ($\approx$7.37 MPa ($\approx$72.8 atm)). In the illustrated embodiment, the temperature and pressure inside the vessel 15 are held at about 100° C. or more and about 8.10 MPa ($\approx$80 atm) or more, respectively. In such a situation, carbon dioxide inside the vessel 15 is all in the supercritical state. The solubility of organic compounds (i.e., carbon compounds in this case) in that supercritical carbon dioxide is very high, and yet the viscosity of that supercritical carbon dioxide is low. Accordingly, the carbon compounds are removable from the BST thin film 14 efficiently.

In this case, the temperature inside the vessel 15 has only to be equal to or higher than the critical temperature Tc of carbon dioxide ($\approx$31.2° C.). Accordingly, the carbon compounds are removable from the film efficiently at a lot lower temperature compared to ordinary heat treatment. In the illustrated embodiment, the quantity of the carbon compounds existing in the BST thin film 14 can be drastically cut down by placing the Si substrate 11 within the vessel 15 at 100° C. and 8.10 MPa ($\approx$80 atm) for 30 minutes.

As a result, the dielectric constant of the BST thin film 14 can be increased by 30% and the leakage current can be reduced by 50%.

Figure 2:
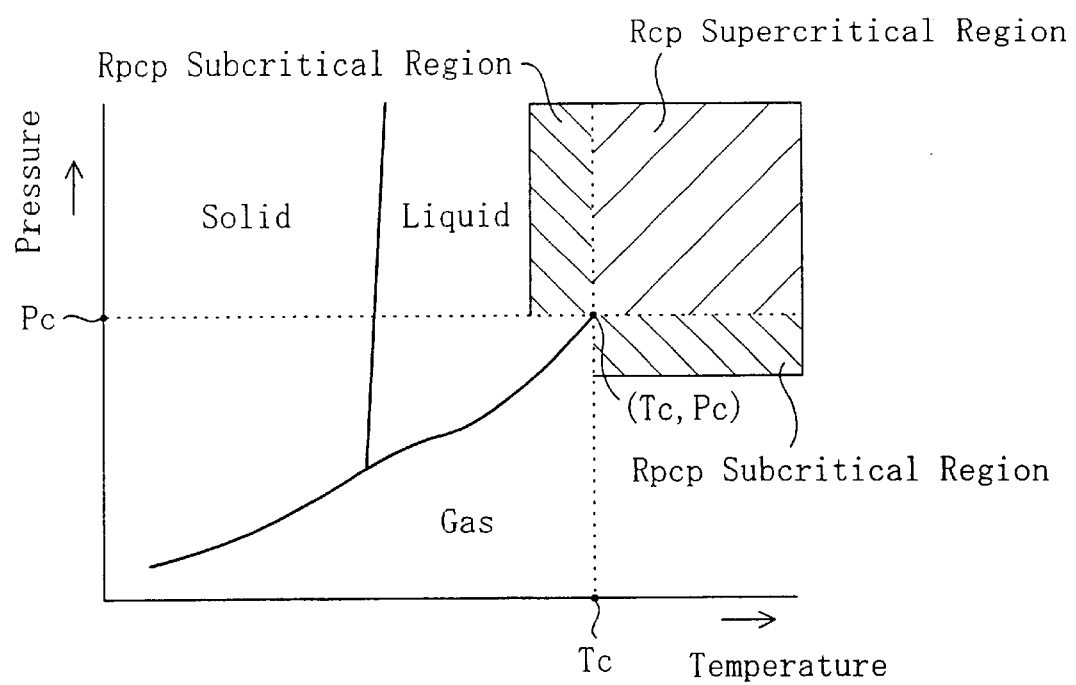
FIG. 2 illustrates the state transition of a fluid such as carbon dioxide or water.

FIG. 2 illustrates the state transition of a fluid such as carbon dioxide or water. In FIG. 2, the axis of abscissas represents the temperature, while the axis of ordinates represents the pressure. The coordinates (Tc, Pc) define a critical point where the temperature and pressure are equal to the critical temperature Tc and critical pressure Pc, respectively. A region where the temperature and pressure are equal to or higher than the critical temperature Tc and critical pressure Pc, respectively, is defined as a supercritical region Rcp. A region where the temperature is equal to or higher than the critical temperature Tc but the pressure is slightly lower than the critical pressure Pc and a region where the pressure is equal to or higher than the critical pressure Pc but the temperature is slightly lower than the critical temperature Tc are defined as subcritical regions Rpcp. It is known that in the supercritical region Rcp, carbon dioxide or water is a supercritical fluid exhibiting different phase and properties than those of gas, liquid or solid.

Figure 3:
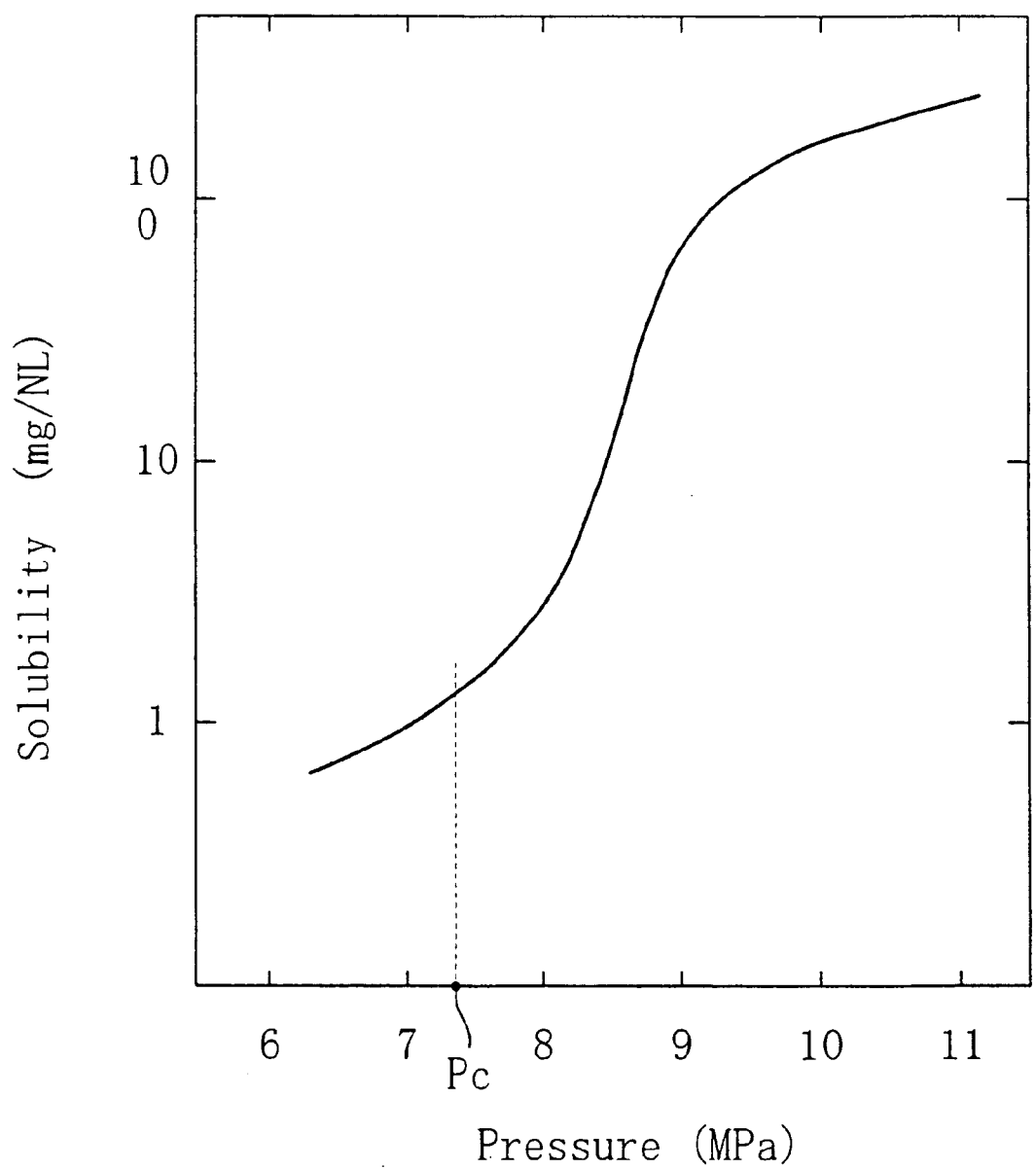
FIG. 3 illustrates the pressure dependence of the solubility of caryophyllene in pure carbon dioxide.

FIG. 3 illustrates the pressure dependence of the solubility of caryophyllene in pure carbon dioxide at 40° C. (>Tc). In FIG. 3, the axis of abscissas represents the pressure (MPa), while the axis of ordinates represents the solubility (mg/NL). It should be noted that 1 NL of $CO_2$ is the quantity of carbon dioxide per 1000 cm$^2$ (i.e., the weight thereof is 1.78 g) at a pressure of 0.1 MPa (=1 bar) and a temperature of 20° C. As can be seen from FIG. 3, on and after the pressure exceeds the critical pressure Pc, the solubility of caryophyllene rises steeply. And if the pressure is further increased, the solubility becomes 100 or more times as high as that at the critical pressure PC.

In the foregoing embodiment, the carbon compounds are removed from the BST thin film 14 using carbon dioxide in the supercritical state. The present invention, however, is in no way limited to such a specific embodiment. This is because it is expected that the solubility of carbon dioxide is rather high even in the subcritical state compared to the ordinary state. That is to say, if there is some restriction on the temperature and pressure of thin film to be formed, substrate and/or components on the substrate, then carbon dioxide in the subcritical region Rpcp, where either temperature or pressure has exceeded the critical point, may also be used.

Also, in the foregoing embodiment, carbon dioxide is used as the supercritical fluid. Alternatively, any arbitrary substance other than carbon dioxide is usable as the supercritical fluid for dissolving the carbon compounds so long as the ability of the substance to dissolve the carbon compounds is sufficiently high. For example, if there is no restriction on temperature and pressure, water with a critical temperature Tc of about 374.3° C. and a critical pressure Pc of about 22.04 MPa (=about 217.6 atm) is also applicable.

Furthermore, if an appropriate amount of entrainer such as ethanol or octane is added to the supercritical or subcritical fluid, then an even greater quantity of carbon compounds is removable depending on the temperature or pressure.

The inventive method is applicable to removing foreign matter from not only the dielectric film in a semiconductor device but also a conductor film or a semiconductor substrate in a semiconductor device or a component in a device of any other type. This is because the same effects may be attained in those cases under appropriate conditions.

Embodiment 2

Next, a technique of forming a thin film in a supercritical fluid by a CVD process will be described as a second exemplary embodiment of the present invention.

FIG. 4 is a partial cross-sectional view schematically illustrating a thin-film forming apparatus for forming a thin film in a supercritical fluid according to the second embodiment.

As shown in FIG. 4, the thin film forming apparatus includes: a vessel 17 for forming a thin film on a substrate by a CVD process; and a sample stage 18 with a heater for supporting the substrate thereon while heating it. The Si substrate 11 is placed on the sample stage 18. In the illustrated embodiment, the silicon dioxide film 12, which will be a field oxide, has been deposited to a thickness of 400 nm on the Si substrate 11. And the platinum thin film 13, which will be a lower electrode for a capacitor, has been formed to a thickness of about 500 nm on the silicon dioxide film 12.

A feeding system for supplying the supercritical fluid and solutes into the vessel 17 includes: a cylinder 20; a temperature/pressure regulator 21; a solute concentration controller 22; and a solute feeder 23. Carbon dioxide is supplied as the supercritical fluid from the cylinder 20. The temperature/pressure regulator 21 controls the temperature and pressure of carbon dioxide to be supplied in such a manner as to make that carbon dioxide enter the supercritical or subcritical region. The solute concentration controller 22 controls the concentration of solutes, which are supplied from the solute feeder 23 as source materials for the thin films that will be formed on the substrate.

The temperature/pressure regulator 21 is connected to the cylinder 20 via a pipe. The controller 21 controls the temperature and pressure of liquid or gaseous $CO_2$ supplied from the cylinder 20 at equal to or higher than the critical temperature of carbon dioxide (=31.2 C) and equal to or higher than the critical pressure of carbon dioxide (=7.37 MPa. (≈72.8 atm)), respectively, thereby producing supercritical carbon dioxide to be supplied to the vessel 17. It should be noted, however, that carbon dioxide may be held in the subcritical region Rpcp.

The solute feeder 23 includes three containers, in which $Ba(DPM)_2$, $Sr(DPM)_2$ and $Ti(O\text{-}iPr)_2(DPM)_2$ are respectively stored as source materials for the BST thin film to be formed on the substrate.

The solute concentration controller 22 is connected to the temperature/pressure regulator 21 and the solute feeder 23 via respective pipes. The controller 22 dissolves the solid or liquid source materials, which have been supplied from the solute feeder 23, as respective solutes in supercritical carbon dioxide, controls the concentration of the solutes at predetermined ones and then supplies the mixture to the vessel 17.

The formation of the BST thin film 14 and removal of carbon compounds from the BST thin film 14 are carried out in the following manner. First, the solute concentration controller 22 adjusts the mixture ratio of supercritical carbon dioxide that has been supplied from the temperature/pressure regulator 21 and the solutes that have been supplied from the solute feeder 23. In the illustrated embodiment, the concentrations of the source materials $Ba(DPM)_2$, $Sr(DPM)_2$ and $Ti(O\text{-}iPr)_2(DPM)_2$ in supercritical carbon dioxide are all controlled at 0.1 mol per liter.

In the vessel 17, the temperature of the substrate is controlled by the sample stage 18 at 650° C., and the organometallic complexes $Ba(DPM)_2$, $Sr(DPM)_2$ and $Ti(O\text{-}iPr)_2(DPM)_2$ that have been supplied from the solute concentration controller 22 are cracked. As a result, the BST thin film 14 is formed on the platinum thin film 13. At the same time, the BST thin film 14 being formed is always exposed to that supercritical carbon dioxide. Thus, most of the carbon compounds, which are produced during the formation of the BST thin film 14, are dissolved in that supercritical carbon dioxide, and almost no carbon compounds enter the BST thin film 14. This is because the carbon compounds, which are produced during the formation of the BST thin film 14, are highly soluble in supercritical carbon dioxide.

Also, the BST thin film 14 is formed only on the Si substrate 11 that has been controlled at 650° C. by the sample stage 18. That is to say, no unwanted thin film is formed on the inner walls of the vessel 17, for example. Accordingly, this apparatus may be regarded as a sort of cold wall CVD system.

If organometallic complexes used as source materials for a thin film are soluble in a supercritical or subcritical fluid as in $Ba(DPM)_2$, $Sr(DPM)_2$ and $Ti(O\text{-}iPr)_2(DPM)_2$ for the BST thin film 14, then the thin film deposition and carbon compound removal can be carried out in parallel. Also, as described in the first embodiment, the resultant BST film shows an increased dielectric constant and reduced leakage current.

In the foregoing embodiment, carbon dioxide is used as an exemplary supercritical fluid. Alternatively, any arbitrary substance other than carbon dioxide is usable as the supercritical fluid for dissolving the carbon compounds so long as the ability of the substance to dissolve the carbon compounds is sufficiently high. For example, if there is no restriction on the temperature and pressure, water with a critical temperature Tc of about 374.3° C. and a critical pressure Pc of about 22.04 MPa (=about 217.6 atm) is also applicable.

Also, if an appropriate amount of entrainer such as ethanol or octane is added to the supercritical or subcritical fluid, then an even greater quantity of carbon compounds is removable depending on the temperature or pressure.

Furthermore, Ba(DPM)$_2$, Sr(DPM)$_2$ and Ti(O-iPr)$_2$(DPM)$_2$ are used in the foregoing embodiment as source materials for the thin film. Alternatively, the inventive film forming method and apparatus is applicable to an MOCVD process using any other organic metals or organometallic complexes.

Moreover, the inventive film forming method and apparatus is applicable not only to the MOCVD process using organic metals or organometallic complexes, but also to a CVD process of any other type.

In the foregoing embodiment, the CVD process is performed by keeping carbon dioxide, which functions not only as the solvent for dissolving the source materials (or metal complexes) Ba(DPM)$_2$, Sr(DPM)$_2$ and Ti(O-iPr)$_2$(DPM)$_2$ for the BST thin film but also as the solvent for dissolving the carbon compounds that have been produced as a result of the reaction, in the supercritical or subcritical state. The present invention, however, is not limited to such a particular embodiment. The effects of the present invention are still attainable even if a CVD process is performed with a solvent, which can only dissolve the carbon compounds, kept in the supercritical or subcritical state.

Embodiment 3

Next, a method for forming a ferroelectric film using a supercritical or subcritical fluid will be described as a third exemplary embodiment of the present invention. FIGS. 5(a) through 6(c) are cross-sectional views illustrating respective process steps for fabricating a semiconductor device according to the third embodiment.

Figure 5A:
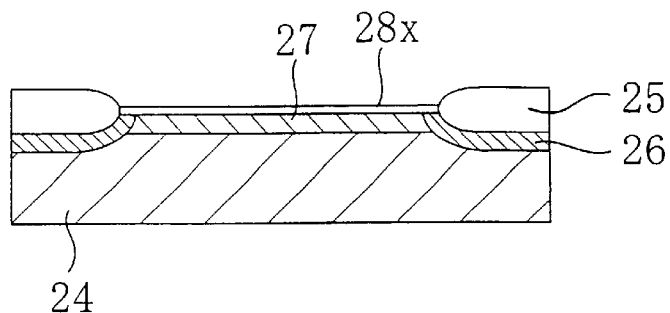
FIGS. 5(a) through 5(d) are cross-sectional views illustrating respective process steps, which are carried out until a gate electrode is completed, for fabricating a semiconductor device according to a third embodiment of the present invention.

First, in the process step shown in FIG. 5(a), a field oxide film 25 is formed by a LOCOS technique on a p-type Si substrate 24 so as to surround an active region. Thereafter, p-type dopant ions such as boron ions are implanted into the Si substrate 24 to control the threshold value of the resulting transistor. As a result, a threshold-controlling implanted layer 27 is formed in the active region of the Si substrate 24 around the surface thereof. In addition, channel stopper regions 26, which have also been doped with a p-type dopant such as boron, are defined within the Si substrate 24 so as to be in contact with the field oxide film 25. A p-well is further formed as the case may be. Then, a silicon dioxide film 28x, which will be a gate insulating film, is formed on the Si substrate 24 by a thermal oxidation process.

The gate insulating film does not have to be the silicon dioxide film 28x, but may be a silicon nitride, silicon oxynitride, aluminum nitride, cerium oxide or BST film. Also, the gate insulating film may be formed by oxidation, nitriding, CVD, MOCVD (i.e., the method of the first embodiment using the organometallic complexes) or MBE.

In the third embodiment, it will be described how to form an n-channel MOS transistor. However, in fabricating a CMOS device, a p-channel MOS transistor should also be formed. In such a case, n-type dopant ions such as phosphorus or arsenic ions are implanted into the p-type Si substrate 24 to control the threshold value of the resulting transistor and to form the channel stopper regions and an n-well.

Figure 5B:
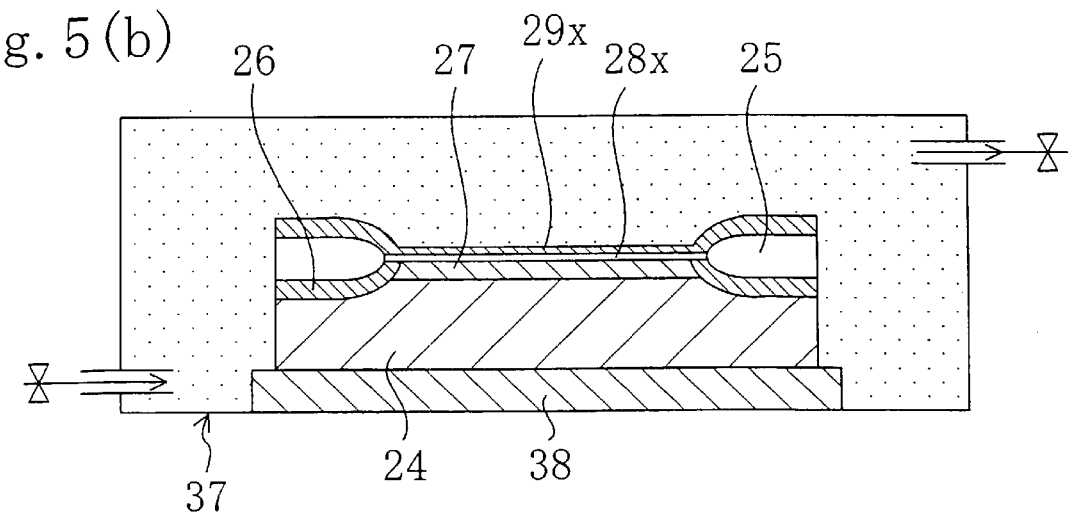

Next, in the process step shown in FIG. 5(b), the Si substrate 24 is placed on a sample stage 38 with a heater within a vessel 37. The temperature of the Si substrate 24 is controlled at about 650° C. by the sample stage 38.

Although not shown in FIG. 5(b), a feeding system for supplying the supercritical fluid and solutes into the vessel 37, which also includes the cylinder, temperature/pressure regulator, solute concentration controller and solute feeder, is used in the third embodiment as in the second embodiment shown in FIG. 4. Carbon dioxide is supplied as the supercritical fluid from the cylinder. The temperature/pressure regulator controls the temperature and pressure of carbon dioxide to be supplied in such a manner as to make that carbon dioxide enter the supercritical or subcritical region. The solute concentration controller regulates the concentration of solutes, which are supplied from the solute feeder as source materials for the thin films that will be formed on the substrate. In the third embodiment, the solute feeder includes two containers for storing Y(DPM)$_3$ and Mn(DPM)$_2$, which are source materials for a YMO thin film (i.e., ferroelectric film) to be formed on the substrate.

The formation of the YMO thin film 29x and removal of carbon compounds from the YMO thin film 29x are carried out in the following manner. In the vessel 37, the temperature of the substrate is controlled by the sample stage 38 at 650° C., and the organometallic complexes Y(DPM)$_3$ and Mn(DPM)$_2$ that have been supplied from the solute concentration controller are cracked and react with the oxidizing agent and so on. As a result, the YMO thin film 29x is formed on the silicon dioxide film 28x. At the same time, the YMO thin film 29x being formed is always exposed to that supercritical carbon dioxide. Thus, most of the carbon compounds, which are produced during the formation of the YMO thin film 29x, are dissolved in that supercritical carbon dioxide, and almost no carbon compounds enter the YMO thin film 29x. This is because the carbon compounds, which are produced during the formation of the YMO thin film 29x, are highly soluble in supercritical carbon dioxide.

In this case, at least one substance selected from the group consisting of oxygen (O$_2$), ozone (O$_3$), nitrous oxide (N$_2$O), hydrogen peroxide (H$_2$O$_2$), nitrogen dioxide (NO$_2$) and nitrogen monoxide (NO) may be used as the oxidizing agent (i.e., oxidation accelerator).

Also, the YMO thin film 29x is formed only on the Si substrate 24 that has been controlled at 650° C. by the sample stage 38. That is to say, no unwanted thin film is formed on the inner walls of the vessel 37. Accordingly, this apparatus may be regarded as a sort of cold wall CVD system.

If organometallic complexes as source materials for a thin film are soluble in a supercritical or subcritical fluid as in Y(DPM)$_3$ and Mn(DPM)$_2$ for the YMO thin film 29x, then the thin film deposition and carbon compound removal can be carried out in parallel. Also, since the carbon compounds are removable substantially completely, the resultant YMO thin film 29x includes almost no residual carbon compounds and exhibits excellent crystallinity.

Figure 5C:
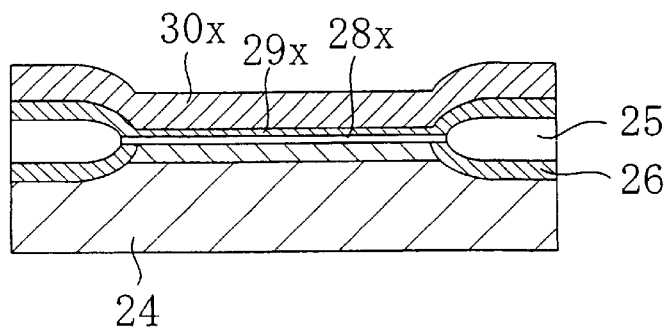

Thereafter, in the process step shown in FIG. 5(c), the Si substrate 24 is taken out of the vessel 37 and then a polysilicon film 30x is deposited to a thickness of about 330 nm over the substrate by an LPCVD process. Then, phosphorus at a concentration as high as about $10^{20}$ cm$^{-3}$ is diffused into the polysilicon film 30x by a solid-phase diffusion process using POCl$_3$, for example, thereby turning the polysilicon film 30x into an n-type heavily doped and degenerated polysilicon film 30x.

Figure 5D:
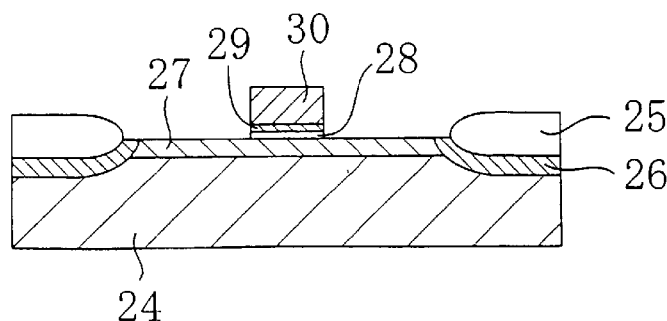

Subsequently, in the process step shown in FIG. 5(d), a photoresist mask (not shown) is defined by photolithography, for example. Thereafter, the polysilicon film 30x and YMO thin film 29x are patterned in this order by a dry etching process such as RIE using the photoresist mask, thereby forming a gate electrode 30 and a ferroelectric layer 29. Under the etching conditions adopted in this embodiment, part of the silicon dioxide film 28x, which is located within the active region surrounded by the field oxide film 25 but is not covered with the photoresist mask, is also etched away to be left as a gate insulating film 28 under the gate electrode 30. Thus, as the case may be, a passivation film should preferably be formed subsequently to cover the exposed surface regions of the Si substrate 24 and gate electrode 30 by performing a thermal oxidation process again. Nevertheless, the entire silicon dioxide film 28x may be left as it is in the process step shown in FIG. 5(d).

Figure 6A:
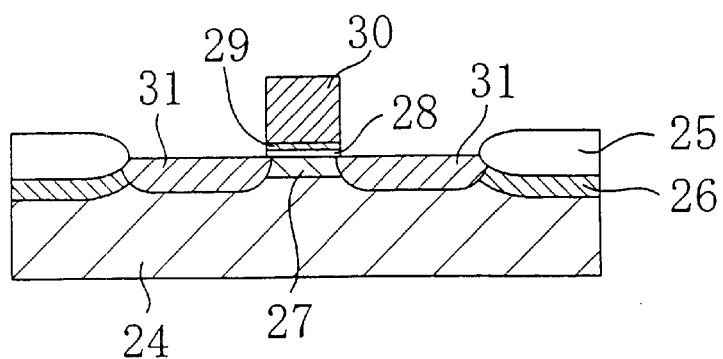
FIGS. 6(a) through 6(c) are cross-sectional views illustrating respective process steps, which are performed after the gate electrode is completed and until a passivation film is formed, for fabricating the semiconductor device according to the third embodiment.

Next, in the process step shown in FIG. 6(a), arsenic or phosphorus ions are implanted into the substrate 24 using the gate electrode 30 and field oxide film 25 as a mask. Then the dopant is activated by an RTA process, for example, thereby forming an n-type doped layer 31 as source/drain regions.

Figure 6B:
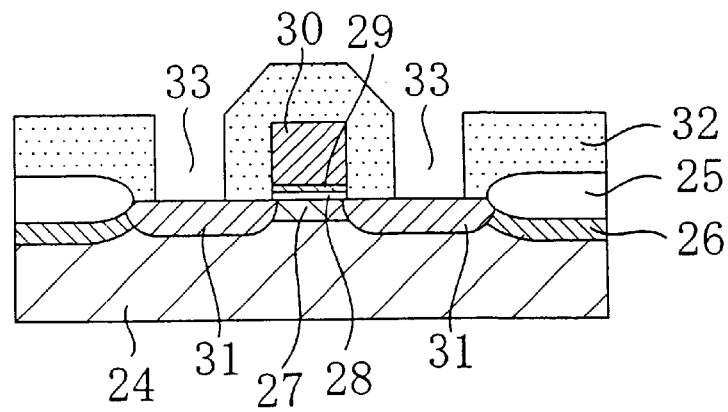

Subsequently, in the process step shown in FIG. 6(b), an interlevel dielectric film 32 of silicon dioxide is deposited to a thickness of about 800 nm over the substrate. Thereafter, contact holes 33 are formed in the film 32 by ordinary photolithography and dry etching processes so as to reach the n-type doped layer 31. In FIG. 6(b), only the contact holes 33, which reach the n-type doped layer 31 as the source/drain regions, are illustrated. Actually though, a contact hole reaching the gate electrode 30 through the interlevel dielectric film 32 is also formed although not shown in FIG. 6(b).

Figure 6C:
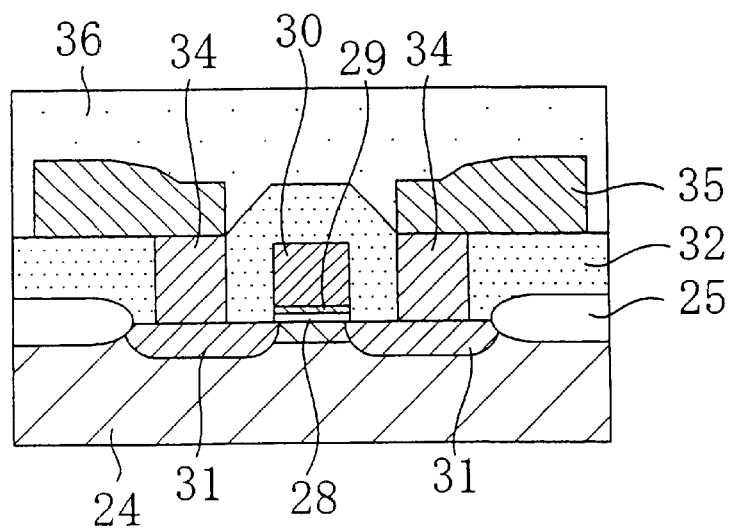

Thereafter, in the process step shown in FIG. 6(c), tungsten plugs 34 are formed by filling in the contact holes 33 with tungsten by a CVD process, for example. Subsequently, an aluminum alloy thin film (often containing Cu and Si) is further deposited to a thickness of about 800 nm over the tungsten plugs 34 and interlevel dielectric film 32 and then patterned by ordinary photolithography and dry etching processes, thereby forming aluminum interconnection lines 35. Finally, a passivation film 36, which includes a plasma oxide film with a thickness of about 200 nm and a plasma nitride film with a thickness of about 600 nm, is formed over the entire surface of the substrate and bonding pads (not shown) are provided.

When an MIS semiconductor device like this operates as an MISFET, the threshold voltage thereof changes if the direction of residual polarization in the ferroelectric layer 29 is controlled appropriately. Thus, this MIS semiconductor device can be used as a nonvolatile memory device.

In the method for forming a ferroelectric layer using supercritical carbon dioxide according to this embodiment, the carbon compounds are removable almost completely while the ferroelectric layer is being formed. That is to say, the thin film formation and carbon compound removal can be carried out concurrently. Thus, the resultant ferroelectric layer exhibits excellent crystallinity and contains substantially no residual carbon compounds. Since the crystallinity improves, the residual polarization is enhanced in the ferroelectric layer and a variation in residual polarization in the ferroelectric layers among lots can be reduced.

In addition, an oxide film can be formed to a desired thickness without keeping the substrate at an elevated temperature unlike the conventional process. Accordingly, the profiles of the dopants, which were introduced into the Si substrate 24 and gate electrode 30, hardly change during the formation of the ferroelectric film (i.e., YMO thin film 29x). Thus, the resultant dopant profiles are also less varied among the lots. As a result, an MFIS transistor with excellent performance can be obtained.

In the foregoing embodiment, the silicon dioxide film 28x is formed on the Si substrate 24 by a thermal oxidation process. Alternatively, the silicon dioxide film 28x may also be formed by utilizing the oxidation reaction of silicon using supercritical or subcritical water as will be described in the fourth embodiment.

In the foregoing embodiment, carbon dioxide is used as an exemplary supercritical fluid. Alternatively, any arbitrary substance other than carbon dioxide is usable as the supercritical fluid for dissolving the carbon compounds so long as the ability of the substance to dissolve the carbon compounds is sufficiently high. For example, if there is no restriction on the temperature and pressure, water with a critical temperature Tc of about 374.3° C. and a critical pressure Pc of about 22.04 MPa (=about 217.6 atm) is also applicable.

Also, if an appropriate amount of entrainer such as ethanol or octane is added to the supercritical or subcritical fluid, then an even greater quantity of carbon compounds is removable depending on the temperature or pressure.

Moreover, the inventive film forming method and apparatus is applicable not only to the MOCVD process using organic metals or organometallic complexes, but also to a CVD process of any other type.

In the foregoing embodiment, the CVD process is performed by making supercritical or subcritical carbon dioxide function not only as the solvent for dissolving the source materials (or metal complexes) $Y(DPM)_3$ and $Mn(DPM)_2$ for the YMO thin film but also as the solvent for dissolving the carbon compounds that have been produced as a result of the reaction. The present invention, however, is not limited to such a particular embodiment. The effects of the present invention are still attainable even if a CVD process is performed with a solvent, which can only dissolve the carbon compounds, kept in the supercritical or subcritical state.

Furthermore, $Y(DPM)_3$ and $Mn(DPM)_2$ are used in the foregoing embodiment as source materials for the thin film. Alternatively, the inventive film forming method and apparatus is applicable to forming a ferroelectric, paraelectric or metal film in accordance with an MOCVD process using any other organic metals or organometallic complexes.

For example, an Mn film may be formed by using only $Mn(DPM)_2$ as a material for the metalorganic film and reducing and dissolving $Mn(DPM)_2$ on the substrate with the reaction chamber kept in the supercritical or subcritical state in the presence of a reducing material such as carbon dioxide or a mixture of carbon dioxide and $NH_3$. The gate electrode of the MFISFET shown in FIG. 6(c) or that of an ordinary MIS transistor may be made of a metal such as aluminum or tungsten by doing so.

In the foregoing embodiment, the gate insulating film 28 is formed out of the silicon dioxide film. Alternatively, the film 28 may be made of silicon nitride, aluminum nitride or cerium oxide, which may be either amorphous or crystalline. But the undercoat film 28 is preferably crystalline, because it is expected that the crystallinity of the ferroelectric layer 29 would further improve and exhibit even more desirable polarization properties in such a case.

Also, an MFMISFET may be formed by interposing a conductor film between the gate insulating film 28 and ferroelectric layer 29 and used as a nonvolatile memory device. In that case, the conductor film may be made of a metal such as Pt or Ir or a metal oxide such as IrO. By providing one of these conductor films, it is expected that the crystallinity of the ferroelectric layer 29 to be formed thereon would further improve.

Embodiment 4

FIGS. 7(a) through 8(c) are cross-sectional views illustrating respective process steps for fabricating a semiconductor device according to a fourth embodiment of the present invention.

Figure 7A:
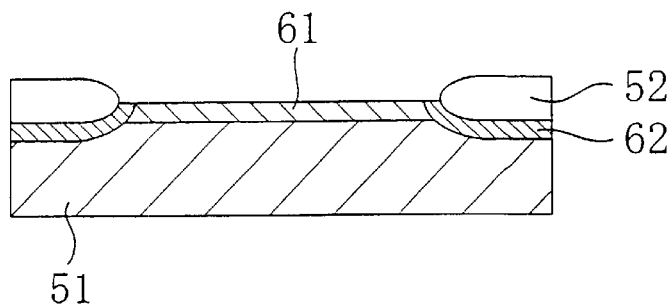
FIGS. 7(a) through 7(d) are cross-sectional views illustrating respective process steps, which are carried out until a gate electrode is completed, for fabricating a semiconductor device according to a fourth embodiment of the present invention.

First, in the process step shown in FIG. 7(a), a field oxide film 52 is formed by a LOCOS or trench isolation process on a p-type Si substrate 51 so as to surround an active region. Thereafter, p-type dopant ions such as boron ions are implanted into the Si substrate 51 to control the threshold value of the resulting transistor. As a result, a threshold-controlling implanted layer 61 is formed in the active region of the Si substrate 51 around the surface thereof. In addition, channel stopper regions 62, which have also been doped with a p-type dopant such as boron, are defined within the Si substrate 51 so as to be in contact with the field oxide film 52. A p-well is further formed as the case may be.

In the fourth embodiment, it will be described how to form an n-channel MOS transistor. However, in fabricating a CMOS device, a p-channel MOS transistor should also be formed. In such a case, n-type dopant ions such as phosphorus or arsenic ions are implanted into the p-type Si substrate 51 to control the threshold value of the resulting transistor and to form the channel stopper regions and an n-well.

Figure 7B:
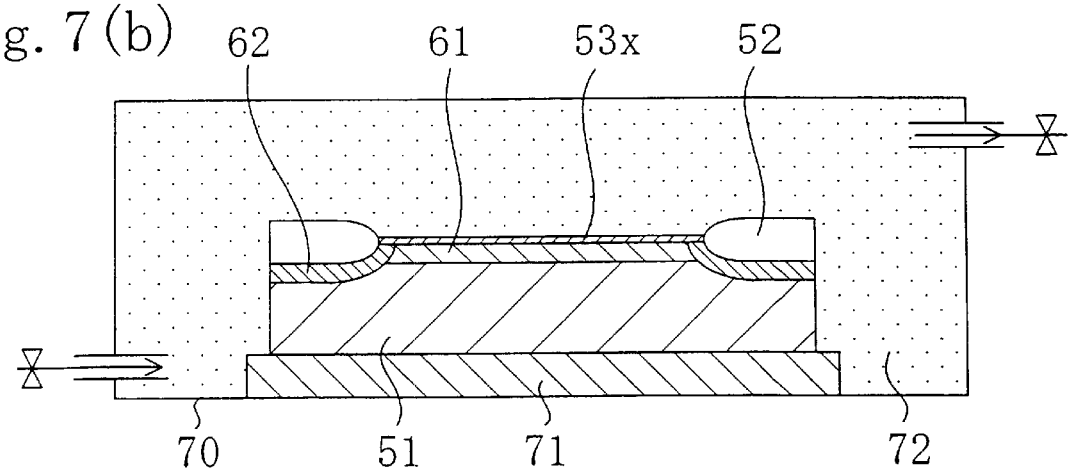

Next, in the process step shown in FIG. 7(b), the Si substrate 51 is placed on a sample stage 71 with a heater within a vessel 70. In this case, the vessel 70 is a housing that is resistible up to 500 atmospheric pressure (=about 50.65 MPa) and about 700° C.

Figure 9:
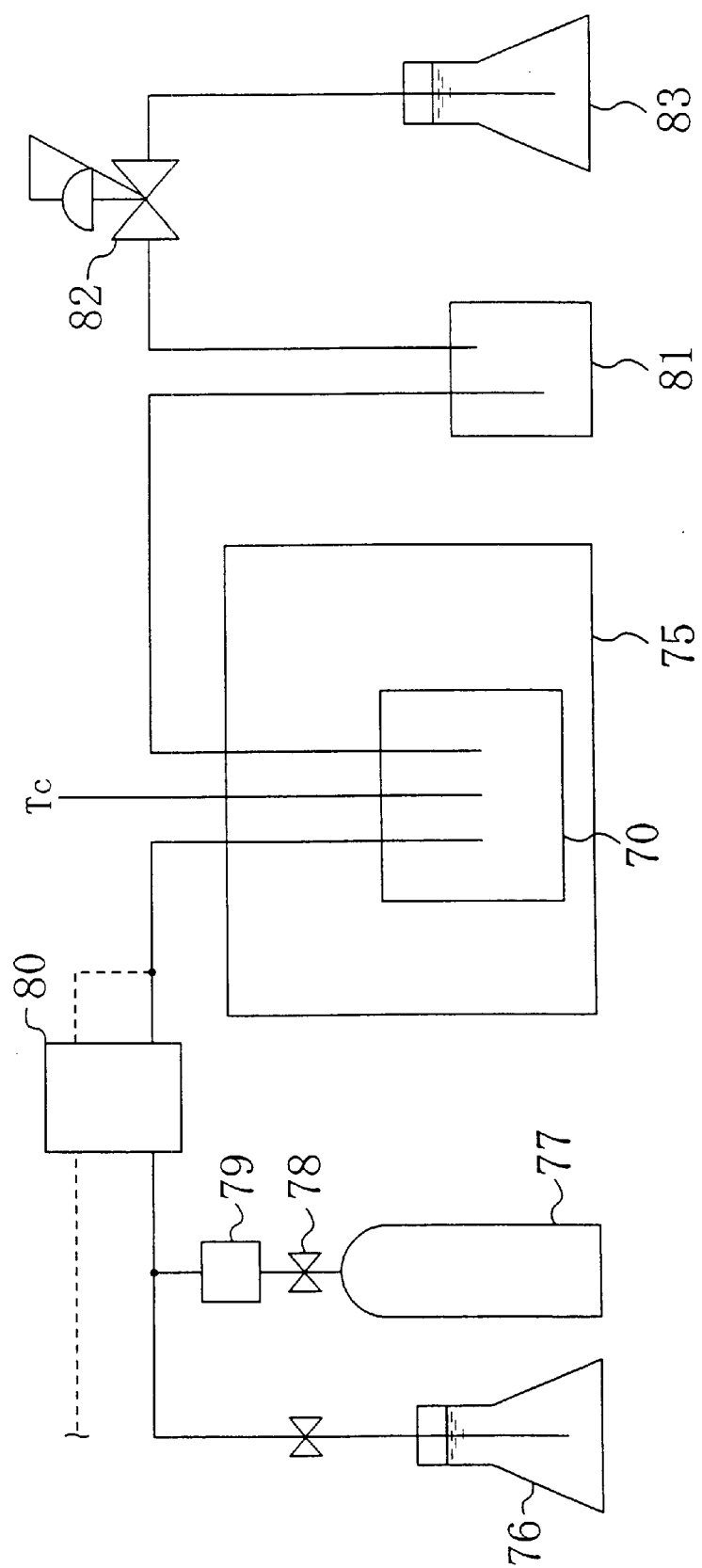
FIG. 9 is a partial cross-sectional view schematically illustrating a structure of a film forming apparatus according to the fourth embodiment.

FIG. 9 schematically illustrates a structure of a film forming apparatus used for an oxidation process in the fourth embodiment. According to the fourth embodiment, the vessel 70 as an exemplary housing is placed within an oven 75 such that the entire vessel 70 can be heated or only the substrate can be heated by the sample stage 71 shown in FIG. 7(b). A feeding system for supplying the supercritical fluid, solutes and additives to the vessel 70 includes: a tank 76; a cylinder 77; a closing valve 78; a cooler 79; and a liquid pump 80. Water is supplied from the tank 76 as an exemplary supercritical fluid and carbon dioxide is supplied from the cylinder 77. The closing valve 78, cooler 79 and liquid pump 80 are provided on the outlet side of the cylinder 77. The liquid pump 80 is provided with a system for supplying the fluids from the solute concentration controller and solute feeder shown in FIG. 4 and various additive fluids (to be described later) to the liquid pump 80 as indicated by the dotted line. This apparatus is so constructed as to supply a mixture of these fluids, water and carbon dioxide into the vessel 70. An exhaust system includes: a cooler/precipitator 81 for cooling down the fluid that has been drained from the vessel 70; a back pressure control valve 82 for controlling the entire space surrounding the vessel 70 at a predetermined elevated pressure; and a container 83 for receiving the exhausted substances. That is to say, this apparatus can selectively use carbon dioxide and/or water as the supercritical fluid(s).

Using this apparatus, the vessel 70 is filled with water 72 in the supercritical state. As described above, the critical temperature of water is about 374° C. and its critical pressure is about 22.04 Mpa (=217.6 atm). In the illustrated embodiment, the temperature and pressure inside the vessel 70 are held at about 400° C. and about 25.33 MPa ($\approx$250 atm), respectively. In such a situation, water inside the vessel 70 is all in the supercritical state. That is to say, the pressure and temperature of the water are raised to reach the supercritical region Rcp where the pressure and temperature are both equal to or higher than their critical ones Pc and Tc as shown in FIG. 2.

If only the temperature of the Si substrate 51 should be further raised, then the temperature of the Si substrate 51 is controllable by using the sample stage 71 if necessary. In the illustrated embodiment, the temperature of the Si substrate 51 is controlled at 600° C. using the sample stage 71.

Next, the Si substrate 51 is exposed to the supercritical water 72 for about 30 minutes. As a result, the surface region of the Si substrate 51 is oxidized by the supercritical water 72 to form a silicon dioxide film 53x, which will be a gate insulating film, to a thickness of about 10 nm over the active region surrounded by the field oxide film 52.

Figure 7C:
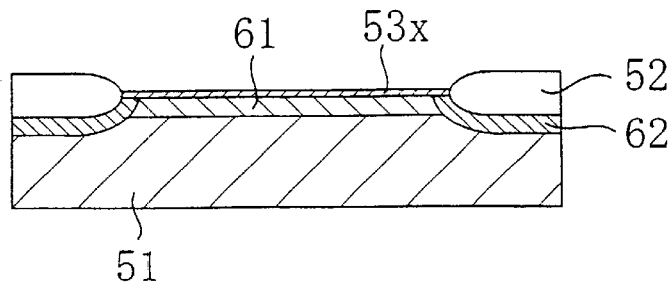

Thereafter, in the process step shown in FIG. 7(c), the Si substrate 51 is taken out of the vessel 70.

Subsequently, in the process step shown in FIG. 7(d), a polysilicon film is deposited to a thickness of about 330 nm over the substrate by an LPCVD process. Then, phosphorus at a concentration as high as about $10^{20}$ cm$^{-3}$ is diffused into the polysilicon film by a solid-phase diffusion process using POCl$_3$, for example, thereby turning the polysilicon film into an n-type heavily doped and degenerated polysilicon film. Next, a photoresist mask (not shown) is defined by photolithography, for example. Thereafter, the n-type heavily doped polysilicon film is patterned by a dry etching process such as RIE using the photoresist mask, thereby forming a gate electrode 54.

Figure 7D:
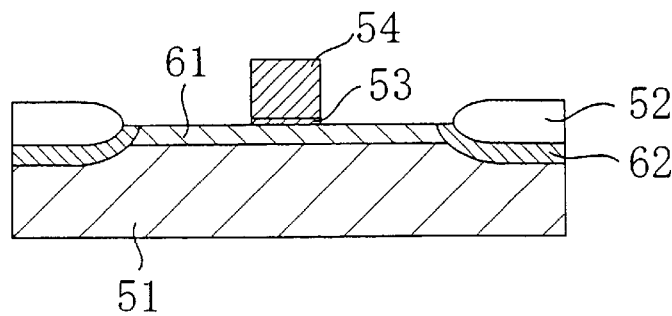

In this process step, part of the silicon dioxide film 53x, which is located in the active region surrounded by the field oxide film 52 but is not covered with the photoresist mask, is also etched away under the etching conditions adopted in this embodiment so as to be left as a gate insulating film 53 under the gate electrode 54 as shown in FIG. 7(d). Thus, as the case may be, a passivation film should preferably be formed subsequently to cover the exposed regions of the Si substrate 51 and gate electrode 54 by placing the substrate in the vessel 70 and exposing the substrate 51 to the supercritical water again. Nevertheless, the entire silicon dioxide film 53x may be left as it is in the process step shown in FIG. 7(d).

If the surface of a polysilicon film is oxidized by a supercritical or subcritical fluid such as the water used in this embodiment, then a much denser oxide film can be formed compared to the prior art thermal oxidation process that is carried out within oxygen gas or water vapor.

Figure 8A:
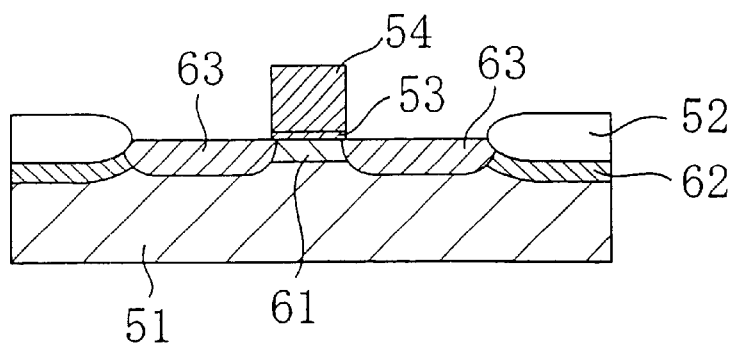
FIGS. 8(a) through 8(c) are cross-sectional views illustrating respective process steps, which are performed after the gate electrode is completed and until an interconnection layer is formed, for fabricating the semiconductor device according to the fourth embodiment.

Next, in the process step shown in FIG. 8(a), arsenic or phosphorus ions are implanted into the substrate 51 using the gate electrode 54 and field oxide film 52 as a mask. Then the dopant is activated by an RTA process, for example, thereby forming an n-type doped layer 63 as source/drain regions.

Figure 8B:
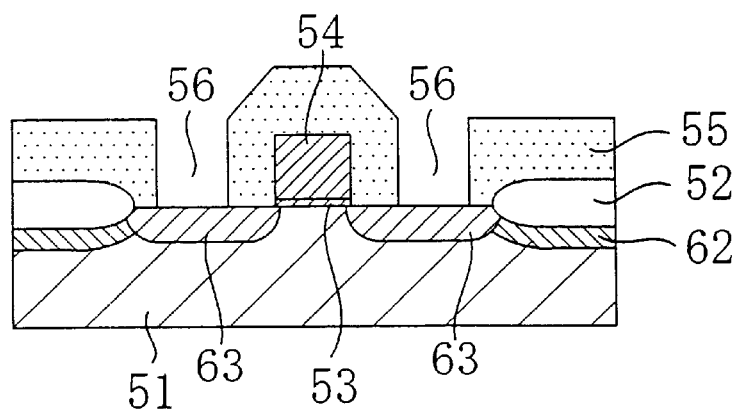

Subsequently, in the process step shown in FIG. 8(b), an interlevel dielectric film 55 of silicon dioxide is deposited to a thickness of about 800 nm over the substrate. Thereafter, contact holes 56 are formed in the film 55 by ordinary photolithography and dry etching processes so as to reach the n-type doped layer 63. In FIG. 8(b), only the contact holes 56, which reach the n-type doped layer 63 to be the source/drain regions, are illustrated. Actually though, a contact hole reaching the gate electrode 54 through the interlevel dielectric film 55 is also formed although not shown in FIG. 8(b).

Figure 8C:
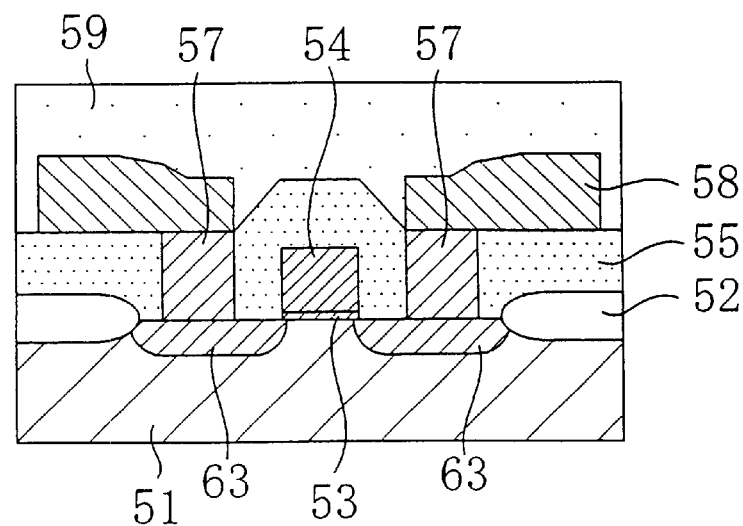

Thereafter, in the process step shown in FIG. 8(c), tungsten plugs 57 are formed by filling in the contact holes 56 with tungsten by a CVD process, for example. Subsequently, an aluminum alloy thin film (often containing Cu and Si) is further deposited to a thickness of about 800 nm over the tungsten plugs 57 and interlevel dielectric film 55 and then patterned by ordinary photolithography and dry etching processes, thereby forming aluminum interconnection lines 58. Finally, a passivation film 59, which includes a plasma oxide film with a thickness of about 200 nm and a plasma nitride film with a thickness of about 600 nm, is formed over the entire surface of the substrate and bonding pads (not shown) are provided.

In the method of forming an oxide film using the supercritical water according to this embodiment, the oxide film can be formed to a desired thickness without keeping the substrate at an elevated temperature unlike the conventional process. Thus, the profiles of the dopants that were introduced into the Si substrate 51 and the gate electrode 54 hardly change during the formation of the oxide film. Accordingly, the resultant dopant profiles are also less varied among the lots. As a result, an MOS transistor with excellent performance can be obtained.

Furthermore, if an appropriate amount of entrainer is added to the supercritical or subcritical fluid, then the oxidation rate and dielectric strength of the oxide film being formed can be further increased.

In the foregoing embodiment, a method of oxidizing a substrate material has been described. Alternatively, the substrate material may be nitrided by a similar method using ammonium or nitrogen in the supercritical state.

Also, in the process step shown in FIG. 7(b), the supercritical water 72 may be drained from the vessel 70 after the silicon dioxide film 53x has been formed. Thereafter, the vessel 70 may be filled with nitrogen or ammonium in the supercritical or subcritical state such that the gate oxide film is exposed to the supercritical or subcritical nitrogen or ammonium. In this manner, the silicon dioxide film 53x can be changed into a silicon oxynitride film.

In the foregoing embodiment, a method for forming a gate insulating film for an MIS transistor using supercritical water has been exemplified. However, the silicon dioxide film can be used not only as the gate insulating film but also as a capacitive insulating film for an MIS capacitor. In an MIS capacitor, control of the dopant profiles in the Si substrate plays a key role in maintaining desired voltage dependence of capacitance. Accordingly, since the dopant profiles within the semiconductor substrate hardly change during the formation of the oxide film if the capacitive insulating film is formed out of the oxide film using the supercritical water as is done in this embodiment, an MIS capacitor with excellent performance can be obtained. It should be noted that a nitride film formed by using supercritical ammonium or nitrogen or an oxynitride film formed in the above-exemplified way may be used as the capacitive insulating film for the MIS capacitor.

The MIS capacitor may also be of a trench type. An MIS capacitor of the trench type is formed by forming trenches in a semiconductor substrate and then filling in these trenches with a capacitive insulating film and a polysilicon film. In the process of forming the trench-type MIS capacitor, after the trenches have been formed in the semiconductor substrate, the semiconductor substrate is exposed to supercritical water, ammonium or nitrogen, thereby forming the capacitive insulating film thereon. If the prior art thermal oxidation process is applied to forming the trench-type MIS capacitor, then the oxidation reaction does not proceed smoothly and it is difficult to form a dense oxide film. This is because the oxygen gas or oxygen in water vapor cannot enter the trenches easily and a reactant gas that has been produced as a result of the oxidation reaction is likely to remain within the trenches. Thus, it is hard for fresh oxygen gas or water vapor to replace the reactant gas. In contrast, according to the present invention, oxygen species of a very high density can be supplied into the trenches by using the supercritical or subcritical fluid such as water. As a result, a dense oxide film can be formed easily.

The inventive method of forming an oxide, nitride or oxynitride film using supercritical or subcritical water is also applicable to forming a capacitive insulating film for an MIM capacitor by oxidizing the surface of a storage node in a DRAM memory cell. The inventive method is further applicable to forming a capacitive insulating film (usually made of ONO) or a tunnel oxide film between the control and floating gate electrodes for a nonvolatile memory of the floating gate type.

FIGS. 10(a) through 10(d) are cross-sectional views illustrating part of process steps, which include the step of forming a silicon oxynitride film by oxidizing a silicon nitride film, for fabricating a logic/nonvolatile memory hybrid semiconductor device.

Figure 10A:
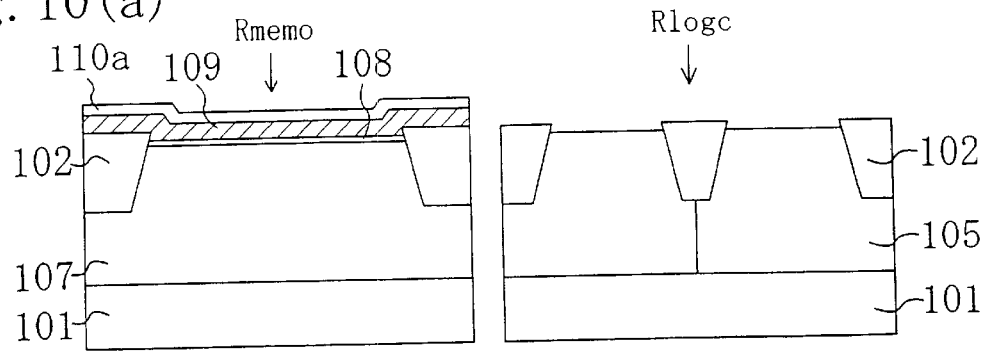
FIGS. 10(a) through 10(d) are cross-sectional views illustrating part of process steps, which include the step of forming an oxynitride film according to the fourth embodiment, for fabricating a logic/nonvolatile memory hybrid semiconductor device.

First, before the process step shown in FIG. 10(a) is performed, a field oxide film 102 of silicon dioxide is formed on memory and logic regions Rmemo and Rlogc of an Si substrate 101. An n-well 105 is defined in part of the logic region Rlogc where a p-channel transistor will be formed. And a p-well 107 is defined over the entire memory region Rmemo and the other part of the logic region Rlogc where an n-channel transistor will be formed.

Next, in the process step shown in FIG. 10(a), silicon dioxide film 108, first polysilicon film 109 and ON film 10a (i.e., a stack of oxide and nitride films) are formed in this order in the memory region Rmemo. The silicon dioxide film 108 and the ON film 110a will be a gate insulating film and an inter-electrode insulating film for a nonvolatile memory device, respectively. It should be noted that respective parts of the gate insulating film 108, first polysilicon film 109 and ON film 110a, which were located in the logic region Rlogc, have been removed by selective etching using a photoresist mask.

Figure 10B:
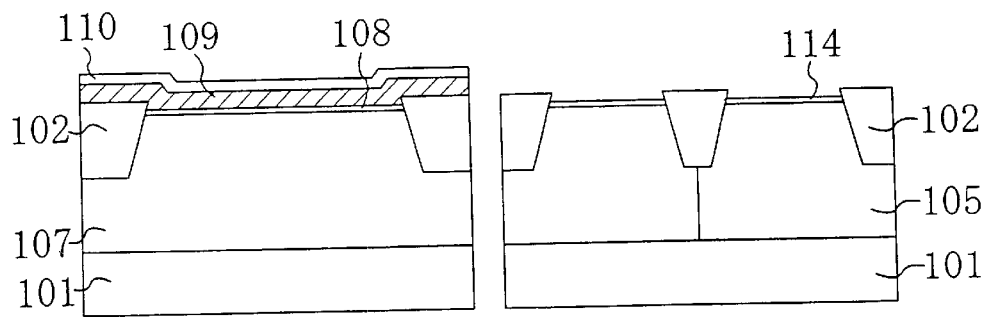

Then, in the process step shown in FIG. 10(b), the substrate is placed within the vessel 70 of the apparatus shown in FIG. 9 and an oxidation process is carried out using supercritical water in the same way as in the process step shown in FIG. 7(b). As a result, a silicon dioxide film 114 is formed in the logic region Rlogc as a gate insulating film for a logic device, and an ONO film 110 is also formed in the memory region Rmemo through the oxidation of the ON film 110a at the surface region thereof. That is to say, oxidation of the Si substrate and oxidation of the nitride film are produced at the same time.

Figure 10C:
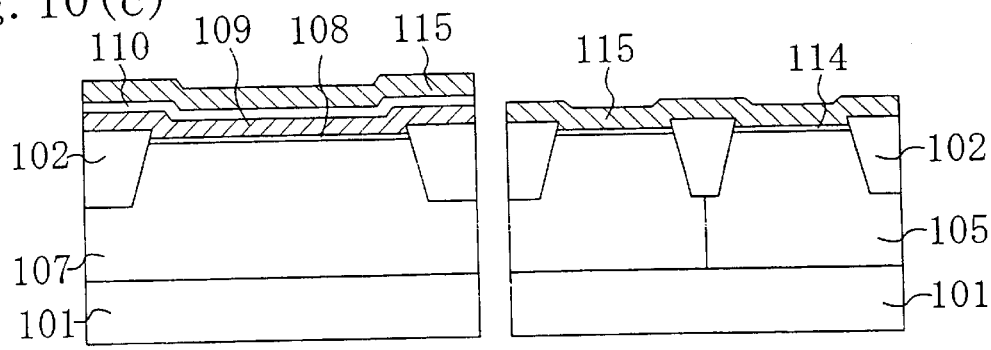

Subsequently, in the process step shown in FIG. 10(c), a second polysilicon film 115 containing phosphorus is formed over the entire surface of the substrate by a CVD process. The second polysilicon film 115 will be shaped into a control gate electrode for the nonvolatile memory device and a gate electrode for the logic device.

Figure 10D:
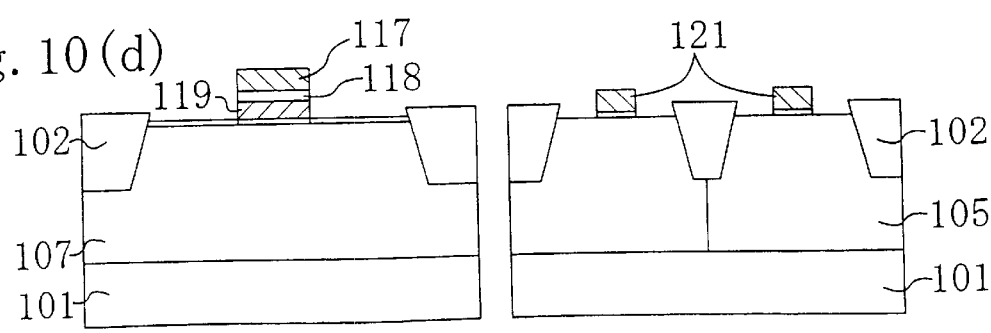

Thereafter, in the process step shown in FIG. 10(d), part of the second polysilicon film 115 in the memory region Rmemo, ONO film 110 and first polysilicon film 109 are dry-etched and patterned in this order using a photoresist mask (not shown). In this manner, a stacked gate, which consists of control gate electrode 117, inter-electrode oxide film 118 and floating gate electrode 119, is formed for the nonvolatile memory device. Subsequently, another part of the second polysilicon film 115 in the logic region Rlogc is dry-etched and patterned using another photoresist mask (not shown, either), thereby forming a gate electrode 121 for the logic device.

That is to say, an oxynitride film can be formed on the surface of the ON film 110a by oxidizing the upper nitride part of the ON film 110a using an oxidizing fluid such as supercritical water. It is naturally possible to form an oxynitride film by oxidizing a nitride film using an oxidizing fluid such as supercritical water in a similar manner.

In the foregoing embodiment, a semiconductor such as silicon or polysilicon is oxidized. However, the inventive concept is also applicable to oxidizing, or repairing the oxygen defects of, dielectrics (e.g., ceramics), superconductors or any other materials, not just to semiconductors.

MODIFIED EXAMPLE 1 OF EMBODIMENT 4

In the fourth embodiment, no additives are dissolved in the supercritical water 72. Optionally, an oxidizing agent like oxygen or nitrous oxide may be dissolved in the water 72. Alternatively, nitrous oxide may be used as primary solvent and water may be added thereto.

Also, if the hydrogen ion concentration of the supercritical water 72 is not appropriate in the process step shown in FIG. 7(b), then a removal rate of the silicon dioxide film 53x might exceed a deposition rate thereof. The silicon dioxide film 53x could not be formed in such a case. This is because if the pH is relatively high, then the balance between oxidation and etching (or reduction) is maintained such that etching prevails over oxidation. Conversely, if the pH is relatively low, then oxidation is prevalent over etching. That is to say, it is believed that the oxidation-etching balance is determined by the hydrogen ion concentration.

Figure 14:
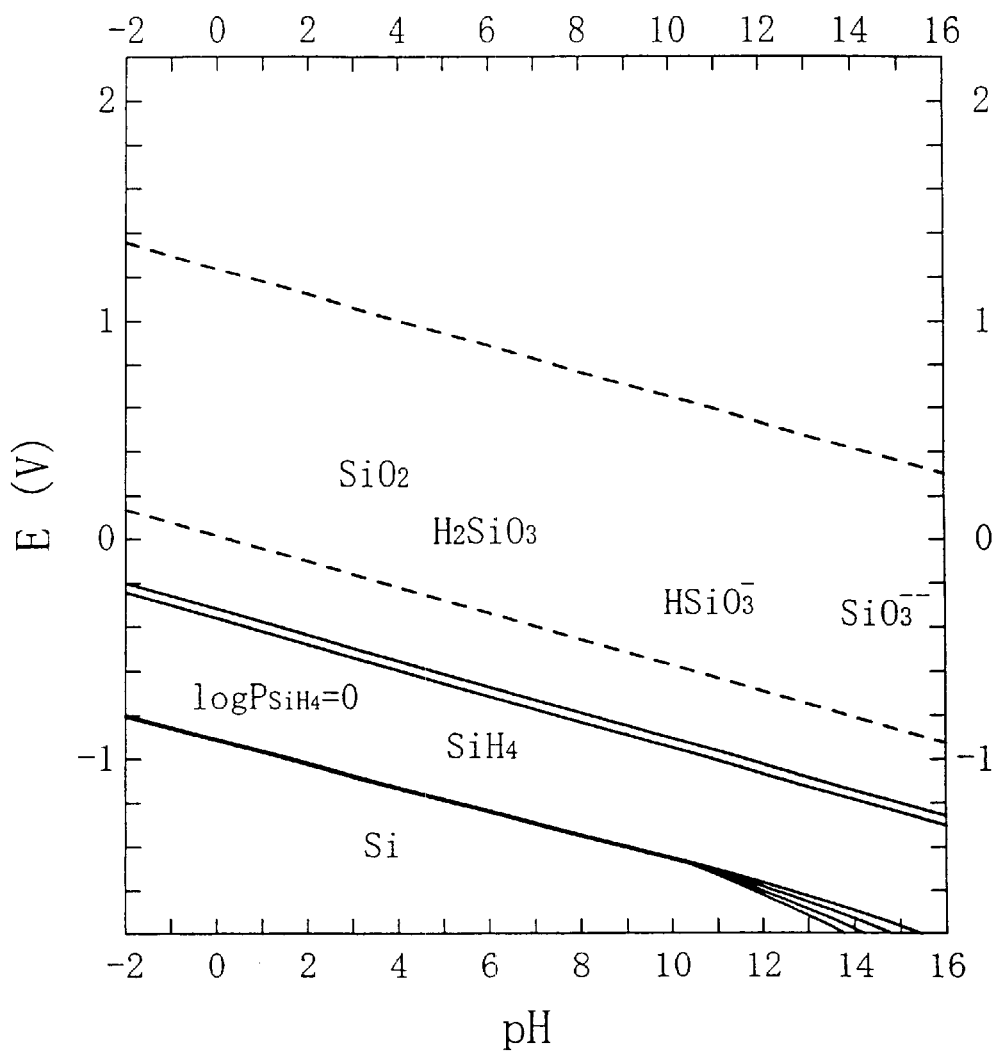
FIG. 14 illustrates potential-pH balance in an oxidation-reduction reaction of Si—$H_2O$ materials.

FIG. 14 illustrates potential-pH balance in the oxidation-reduction reaction (Redox) of Si—$H_2O$ substances. In FIG. 14, the axis of abscissas represents the pH and the axis of ordinates represents the voltage. Take a look at the state where the voltage is zero. As can be seen, the balance between $SiO_2$ and $H_2SiO_3$ and their ions $HSiO_3^-$ and $SiO_3^-$ changes with the pH level. As shown in FIG. 14, when the voltage is zero, solid $SiO_2$ or $H_2SiO_3$ exists in a stabilized state where the hydrogen ion concentration is high (i.e., the pH is low), thus accelerating oxidation. On the other hand, $HSiO_3^-$ or $SiO_3^-$ exists in a stabilized state where the hydrogen ion concentration is low (i.e., the pH is high enough to exceed 9), thus accelerating etching.

In this case, if an appropriate amount of oxidation accelerator such as oxygen ($O_2$), ozone ($O_3$), hydrogen peroxide ($H_2O_2$), nitrous oxide ($N_2O$), nitrogen monoxide (NO) or nitrogen dioxide ($NO_2$) is added to the water, then the number of hydrogen groups can be relatively small and the oxidation of silicon can be accelerated. As a result, the silicon dioxide film can be formed smoothly and rapidly.

Alternatively, even when an appropriate amount of substance containing chlorine ions such as hydrogen chloride, chlorine, sodium chloride, potassium chloride, calcium chloride or other metal chloride is added to a fluid like the supercritical or subcritical water, the oxidation of silicon can also be accelerated and the silicon dioxide film can also be formed smoothly and rapidly. Furthermore, if an appropriate amount of substance containing chlorine ions is added to the supercritical water and the temperature and pressure are controlled correspondingly, then a crystalline silicon dioxide film (i.e., a crystal film) can be formed on the Si substrate.

Moreover, the oxidation of the Si substrate can also be accelerated even by adding alkali metal ions such as potassium (K), sodium (Na) or calcium (Ca) ions at an appropriate concentration to a supercritical or subcritical fluid.

As described above, supercritical water is able to dissolve a silicon dioxide film formed. Thus, if an oxide film should be formed at a pressure of about 30 MPa or more, then a substance containing a constituent element of an object to be processed is preferably contained in the fluid such as supercritical water. For example, a substance containing Si (or an Si compound), which is a constituent element of the Si substrate 51, should preferably be contained in the supercritical water according to the fourth embodiment. If a large quantity of Si compound is contained in the water, then Si in a quantity exceeding a certain limit is insoluble in the water. Thus, the dissolution of the Si substrate and silicon dioxide film in the water is suppressible. In other words, the oxidation-etching balance shifts toward a point where Si is less likely to be produced, i.e., oxidation prevails over etching. Accordingly, if a substance containing a constituent element of an object to be processed is contained in a fluid such as supercritical water, then the oxidation or nitriding can be accelerated.

MODIFIED EXAMPLE 2 OF EMBODIMENT 4

In the fourth embodiment, water in the supercritical region Rcp, where the temperature and pressure are equal to or higher than the critical temperature Tc and critical pressure PC, respectively, is used. Alternatively, water, ammonium or nitrogen in a subcritical region Rpcp, where the temperature is equal to or higher than the critical temperature Tc but the pressure is slightly lower than the critical pressure Pc or the pressure is equal to or higher than the critical pressure Pc but the temperature is slightly lower than the critical temperature Tc, may also be used (see FIG. 2). Particularly when there is a restriction on the temperature and pressure due to the thickness of an oxide, nitride or oxynitride film to be formed or the type of the substrate, the use of water, ammonium or nitrogen in the subcritical region Rpcp may sometimes be more advantageous. Even in such a situation, conditions can be defined easily not to adversely affect the characteristics of a device to be formed and the same effects are also attainable.

The present inventors also found based on the results of the experiments to be described below that a higher oxidation rate might sometimes be attained in the subcritical region rather than in the supercritical region.

The results of the experiments relating to the first modified example of the fourth embodiment revealed that when the pH is relatively high, hydroxyl ions accelerate etching. Thus, to accelerate the oxidation, the concentration of hydroxyl ions should be kept low or the dissociation constant should be reduced. However, if oxidation is excessively prevalent for a long time, then defects of other types, like erosion of the vessel, might be brought about. Accordingly, a smaller dissociation constant would be the better option.

Figure 11:
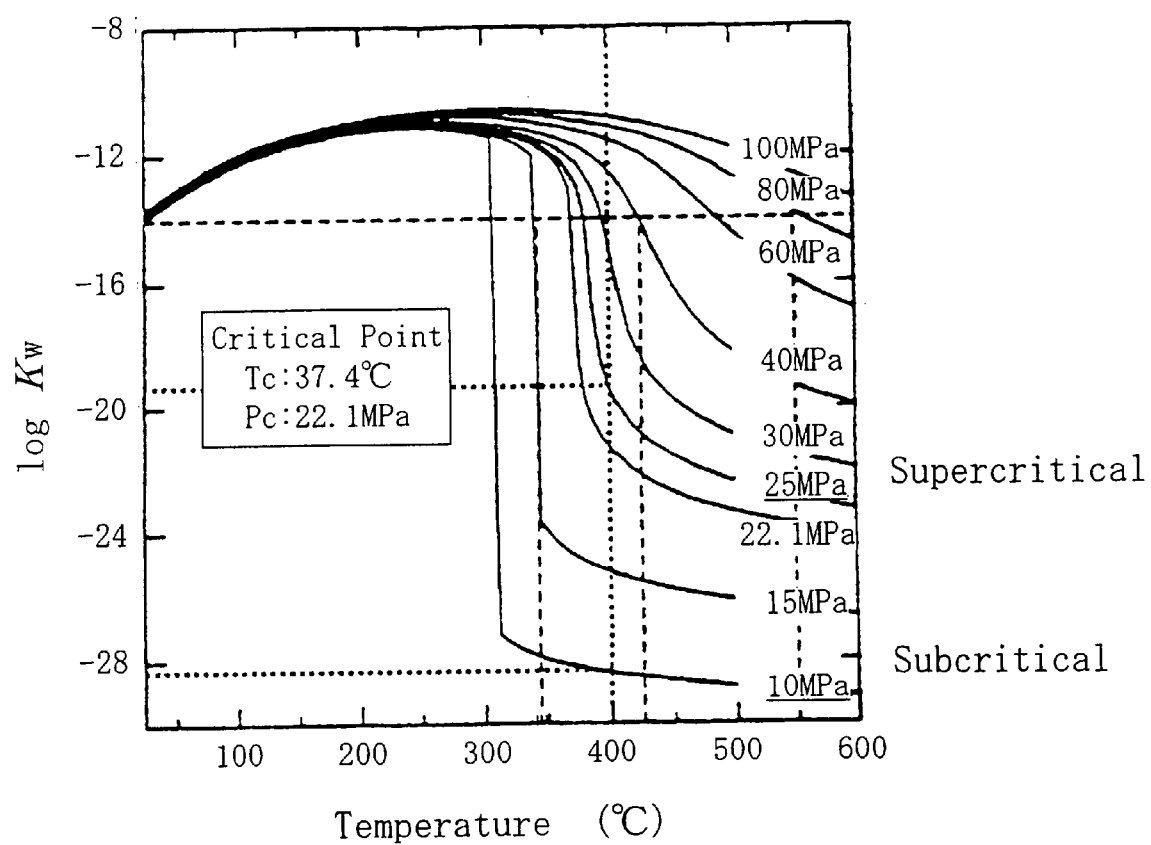
FIG. 11 illustrates a relationship between the temperature of water and the dissociation constant $K_w$ using pressure as a parameter according to a second modified example of the fourth embodiment.

FIG. 11 illustrates relationships between the water temperature and the dissociation constant $K_w$ using pressure as a parameter (which is disclosed by K. S. Pitzer in J. Phys. Chem. 86, 4704 (1982)). In FIG. 11, the axis of abscissas represents the temperature (° C.), while the axis of ordinates represents a logarithm log $K_w$ of the dissociation constant $K_w$. As shown in FIG. 11, when the pressure of water is around 15 or 10 Mpa, which is lower than the critical pressure thereof at 25.33 MPa, the dissociation constant $K_w$ decreases stepwise at a particular temperature. For example, if the pressure is 15 MPa, log $K_w$ decreases steeply from about −12 to about −24 at a temperature around 340° C. On the other hand, if the pressure is 10 MPa, log $K_w$ decreases drastically from about −11 to about −27 at a temperature around 310° C. Since the critical temperature of water is 374° C., each region where log $K_w$ decreases drastically belongs to neither supercritical nor subcritical region as can be seen from FIG. 2. However, as shown in FIG. 11, the dissociation constant $K_w$ decreases more stably in the subcritical region where the pressure is 10 or 15 Mpa and the temperature is equal to or higher than the critical temperature of 374° C.

As described above, the oxidation-etching balance is defined as a relationship between dissolution caused by ions and oxidation caused by radicals. Taking this into consideration, the oxidation rate would be greatly increased by maintaining the fluid in such a state as corresponding to a very small dissociation constant as shown in FIG. 11. Based on these findings, the present inventors carried out experiments to know how the oxidation rate changes depending on whether the pressure is at around the critical pressure or lower than the critical pressure.

Figure 12:
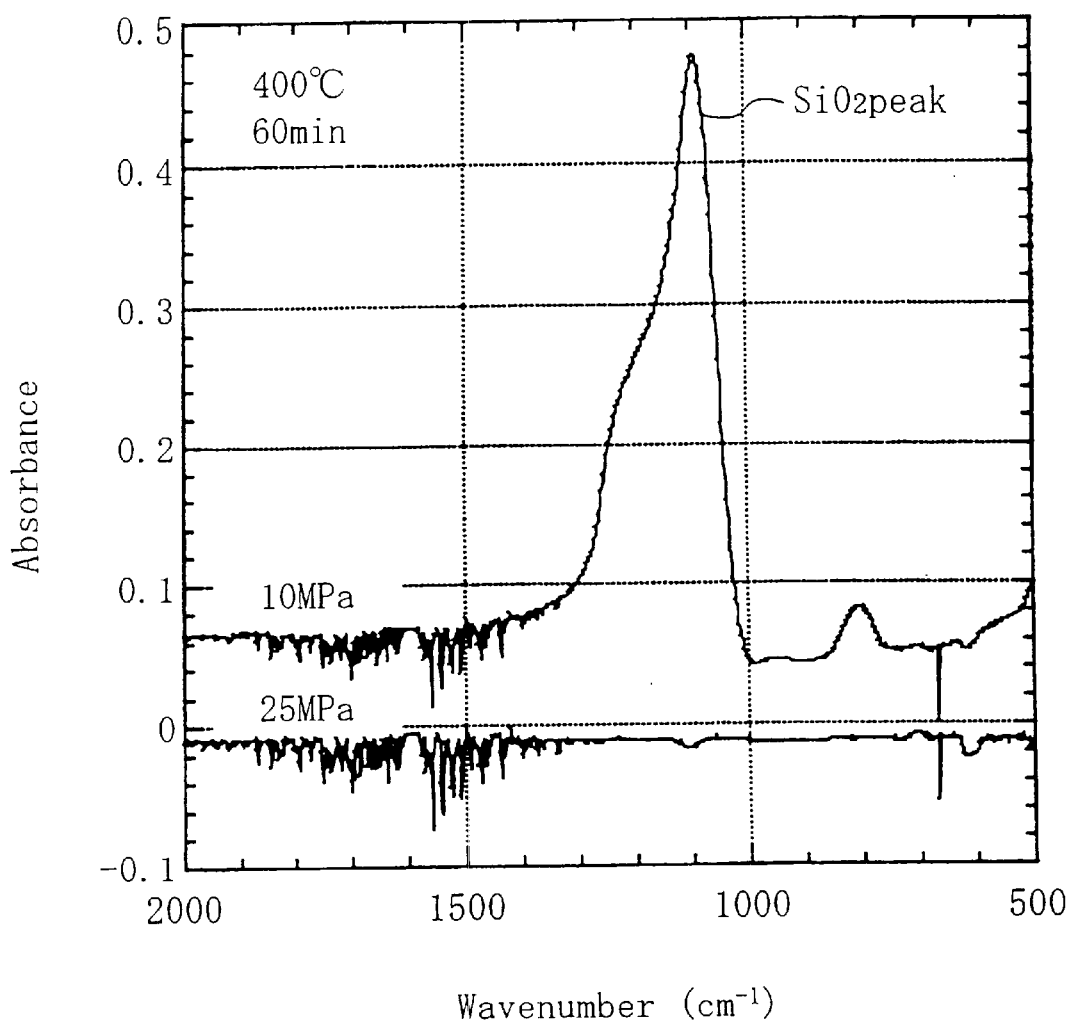
FIG. 12 illustrates the infrared absorption spectra of an Si substrate that was exposed to water at 400° C. at pressures of 10 and 25 MPa according to the second modified example of the fourth embodiment.

FIG. 12 illustrates the infrared absorption spectra of the Si substrate, which was exposed to water at 400° C. for 60 minutes at respective pressures of 10 and 25 MPa. As shown in FIG. 12, a peak corresponding to the absorption area of $SiO_2$ is observable in the infrared absorption spectrum of the Si substrate that was exposed to the water at 10 MPa. On the other hand, there are no such peaks indicating the existence of $SiO_2$ in the infrared absorption spectrum of the Si substrate that was exposed to the water at 25 MPa.

Taking these facts into account, it is believed that the oxidation-etching balance can be modified to make oxidation prevail over etching if the oxidation process is performed using a fluid kept in the subcritical region where the pressure is equal to or lower than the critical pressure Pc and the temperature is equal to or higher than the critical temperature Tc or in a region where the pressure is equal to or lower than the critical pressure Pc and the temperature is lower than, but close to, the critical temperature Tc. It is not clear so far why such oxidation acceleration phenomenon happens. But this fact was already confirmed empirically.

To take advantage of this phenomenon, the Si substrate should not be exposed to water at a temperature lower than 300° C., i.e., corresponding to a large dissociation constant $K_w$, as can be seen from FIG. 11. This is because etching prevails over oxidation in that case. Thus, water, which has been heated up to about 400° C. in advance, should be kept at a pressure of about 10 or 15 MPa and the vessel should not be cooled down until the water has been blown off by nitrogen gas, for example, and drained completely after the oxidation process is over.

MODIFIED EXAMPLE 3 OF EMBODIMENT 4

In this third modified example, it will be described how the oxidation process of the fourth embodiment is applicable to forming an oxide film for a TFT on a glass substrate.

FIGS. 13(a) through 13(d) are cross-sectional views illustrating respective process steps, which include the oxidation process step of the fourth embodiment, for fabricating a TFT according to this modified example.

First, before the process step shown in FIG. 13(a) is performed, a non-doped polysilicon film is deposited on a glass substrate 131 made of Pyrex glass, and then patterned. In this manner, semiconductor layers 132a and 132b are formed in respective regions Rn and Rp where n- and p-channel TFTs will be formed. And the entire glass substrate 131, on which these semiconductor layers 132a and 132b have been formed, is placed within the vessel 70 in the apparatus shown in FIG. 9. After that, the oxidation process using the supercritical water is performed as in the process step shown in FIG. 7(b). In this case, though, the temperature is kept at about 400° C. As a result, the respective surface regions of the semiconductor layers 132a and 132b of polysilicon are oxidized so that a gate insulating film 133 of polysilicon is formed.

Next, in the process step shown in FIG. 13(b), the glass substrate 131 is taken out of the vessel 70. Then, gate electrodes 134a and 134b are formed out of an n-type polysilicon film on respective parts of the gate insulating film 133 over the center regions of the semiconductor layers 132a and 132b. Next, a photoresist mask 135 is defined to cover the region Rn where an n-channel TFT will be formed. Subsequently, using the photoresist mask 135 and gate electrode 134b as a mask, p-type dopant ions such as boron ($B^+$) ions are implanted into the semiconductor layer 132b, thereby forming a p-type doped layer 136 in the semiconductor layer 132b on right- and left-hand sides of the gate electrode 134b.

Then, in the process step shown in FIG. 13(c), a photoresist mask 137 is defined to cover the region Rp where a p-channel TFT will be formed. Subsequently, using the photoresist mask 137 and gate electrode 134a as a mask, n-type dopant ions such as phosphorus ($P^+$) ions are implanted into the semiconductor layer 132a, thereby forming an n-type doped layer 138 in the semiconductor layer 132a on right- and left-hand sides of the gate electrode 134a.

Finally, in the process step shown in FIG. 13(d), an interlevel dielectric film 140 of silicon dioxide and Al interconnection lines 141, which are connected to the doped layers of the respective TFTs, are formed over the substrate.

In the prior art, a thermal oxidation process is performed on a TFT for a liquid crystal panel at an elevated temperature using an expensive small quartz substrate, which is resistible up to 1000° C. Such a process, however, is neither cost-effective nor generally applicable. According to a technique, the oxidation can be performed at 600° C. or less, but the expensive quartz substrate is still needed in such a case. In the current state of the art, a technique of forming a thermal oxide film at 450° C. or less while using an inexpensive general-purpose glass substrate has not been established yet.

In contrast, according to this embodiment, a gate insulating film of silicon dioxide film can be formed by oxidizing a polysilicon film at as low a temperature as 450° C. or less. Thus, a general-purpose substrate made of Pyrex glass, for example, can be used. That is to say, a TFT including a highly reliable gate insulating film obtained by thermal oxidation can be formed on an inexpensive general-purpose glass substrate, thus contributing to cost reduction of a liquid crystal panel.

What is claimed is:

1. A method for forming a thin film, comprising the steps of:

a) forming a thin film on a substrate by making a source material, which produces first and second substances when reacted, come into contact with the substrate such that the thin film is made of the first substance including the second substance;

b) placing the substrate on which the thin film is formed within a vessel;

c) moving the second substance included in the thin film which is made of the first substance to a supercritical or subcritical fluid by filling the vessel with the supercritical or subcritical fluid; and d) draining the supercritical or subcritical fluid including the second substance from the vessel.

2. The method of claim 1, wherein the source material contains an organic metal.

3. The method of claim 1, wherein the source material contains organometallic complexes.

4. The method of claim 1, wherein the source material is a compound containing a dipivaloylmethanato (DPM) group.

5. The method of claim 1, wherein the second substance is made of a carbon compound.

6. The method of claim 1, wherein the source material is dissolved in a solvent.

7. The method of claim 6, wherein the solvent of the source material is at least one compound selected from the group consisting of hydrocarbon and halogenated hydrocarbon compounds.

8. The method of claim 1, wherein carbon dioxide is used as the solvent.

9. The method of claim 1, wherein water is used as the solvent.

10. The method of claim 1, wherein entrainer is added to the solvent.

11. The method of claim 10, wherein ethanol or octane is used as the entrainer.

12. The method of claim 1, wherein the substrate is heated up.

13. The method of claim 1, wherein the substrate is heated up to 400 to 700° C.

* * * * *

UNITED STATES PATENT AND TRADEMARK OFFICE
CERTIFICATE OF CORRECTION

PATENT NO. : 6,716,663 B2
DATED : April 6, 2004
INVENTOR(S) : Kiyoyuki Morita et al.

It is certified that error appears in the above-identified patent and that said Letters Patent is hereby corrected as shown below:

<u>Column 24,</u>
Line 2, change "contains an organic metal." to -- contains an organic metal compound. --

Signed and Sealed this

Twenty-second Day of March, 2005

JON W. DUDAS
*Director of the United States Patent and Trademark Office*